United States Patent
Yokoyama et al.

(10) Patent No.: US 9,159,923 B2
(45) Date of Patent: Oct. 13, 2015

(54) EVAPORATION DONOR SUBSTRATE, METHOD FOR MANUFACTURING THE SAME, AND METHOD FOR MANUFACTURING LIGHT-EMITTING DEVICE

(75) Inventors: Kohei Yokoyama, Kanagawa (JP); Yosuke Sato, Kanagawa (JP); Tomoya Aoyama, Kanagawa (JP); Rena Takahashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 948 days.

(21) Appl. No.: 12/338,449

(22) Filed: Dec. 18, 2008

(65) Prior Publication Data

US 2009/0169809 A1 Jul. 2, 2009

(30) Foreign Application Priority Data

Dec. 26, 2007 (JP) ................................ 2007-333565

(51) Int. Cl.
 *B05D 5/12* (2006.01)
 *H01L 51/00* (2006.01)
 *C23C 14/04* (2006.01)

(52) U.S. Cl.
 CPC .......... *H01L 51/0013* (2013.01); *C23C 14/048* (2013.01); *Y10T 428/24331* (2015.01)

(58) Field of Classification Search
 USPC .......................................................... 427/66
 See application file for complete search history.

(56) References Cited

U.S. PATENT DOCUMENTS

| 5,851,709 | A | * | 12/1998 | Grande et al. ..................... 430/7 |
| 5,937,272 | A | | 8/1999 | Tang |
| 5,994,028 | A | * | 11/1999 | Lee ............................ 430/273.1 |
| 6,165,543 | A | | 12/2000 | Otsuki et al. |
| 6,283,060 | B1 | | 9/2001 | Yamazaki et al. |
| 6,689,492 | B1 | | 2/2004 | Yamazaki et al. |
| 6,703,179 | B2 | | 3/2004 | Tyan |
| 6,776,847 | B2 | | 8/2004 | Yamazaki et al. |

(Continued)

FOREIGN PATENT DOCUMENTS

| EP | 0 913 870 A2 | 5/1999 |
| EP | 1 484 757 A2 | 12/2004 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, book 1, May 22, 2007, pp. 161-164.

(Continued)

*Primary Examiner* — Austin Murata
(74) *Attorney, Agent, or Firm* — Husch Blackwell LLP

(57) ABSTRACT

An evaporation donor substrate that makes it possible to evaporate only a desired evaporation material in the case of performing deposition by an evaporation method. Thus, the use efficiency of an evaporation material can be increased resulting in reduction in production cost, and further a film with high uniformity can be deposited. The evaporation donor substrate can be obtained by forming a reflective layer having an opening over a substrate, forming a thermal insulation layer having a light-transmitting property separately over the substrate and the reflective layer, forming a light absorption layer over the thermal insulation layer, and forming a material layer over the light absorption layer.

16 Claims, 15 Drawing Sheets

(56) References Cited

U.S. PATENT DOCUMENTS

| | | |
|---|---|---|
| 7,316,983 B2 | 1/2008 | Yamazaki et al. |
| 7,674,749 B2 | 3/2010 | Kang et al. |
| 7,682,678 B2 | 3/2010 | Takamori et al. |
| 7,727,847 B2 | 6/2010 | Tanaka et al. |
| 7,887,987 B2 | 2/2011 | Matsuo |
| 7,951,521 B2 | 5/2011 | Matsuo |
| 7,994,021 B2 | 8/2011 | Miyairi et al. |
| 8,080,811 B2 | 12/2011 | Yokoyama et al. |
| 8,153,201 B2 | 4/2012 | Aoyama et al. |
| 8,277,871 B2 | 10/2012 | Aoyama et al. |
| 2003/0180473 A1* | 9/2003 | Nishihara et al. ............ 427/457 |
| 2004/0065552 A1* | 4/2004 | Cohen ............................ 205/118 |
| 2004/0065902 A1 | 4/2004 | Yamazaki et al. |
| 2005/0005848 A1 | 1/2005 | Yamazaki et al. |
| 2005/0048295 A1* | 3/2005 | Kim et al. ..................... 428/447 |
| 2005/0145326 A1 | 7/2005 | Hatwar |
| 2006/0243377 A1 | 11/2006 | Matsuo et al. |
| 2006/0246240 A1* | 11/2006 | Matsuda et al. ........... 428/32.39 |
| 2008/0081115 A1 | 4/2008 | Yamazaki et al. |
| 2008/0113292 A1* | 5/2008 | Matsuo ..................... 430/270.1 |
| 2008/0268135 A1 | 10/2008 | Yokoyama et al. |
| 2009/0075214 A1 | 3/2009 | Hirakata et al. |
| 2009/0104403 A1 | 4/2009 | Aoyama et al. |
| 2009/0104721 A1 | 4/2009 | Hirakata et al. |
| 2009/0104835 A1 | 4/2009 | Aoyama et al. |
| 2009/0142510 A1 | 6/2009 | Takahashi et al. |
| 2009/0197017 A1 | 8/2009 | Tanaka et al. |
| 2012/0251772 A1 | 10/2012 | Aoyama et al. |

FOREIGN PATENT DOCUMENTS

| | | |
|---|---|---|
| EP | 1 650 046 A1 | 4/2006 |
| EP | 1 787 822 A2 | 5/2007 |
| JP | 11-237504 | 8/1999 |
| JP | 2000-256877 | 9/2000 |
| JP | 2004-103406 | 4/2004 |
| JP | 2005-153276 A | 6/2005 |
| JP | 2006-004538 A | 1/2006 |
| JP | 2006-123546 | 5/2006 |
| JP | 2006-228649 | 8/2006 |
| JP | 2006-309995 | 11/2006 |
| JP | 2007-105777 A | 4/2007 |
| JP | 2008-66147 | 3/2008 |
| JP | 2009-123692 | 6/2009 |
| JP | 2009-123693 | 6/2009 |
| KR | 2004-0105562 A | 12/2004 |
| KR | 2007-0053641 A | 5/2007 |

OTHER PUBLICATIONS

Korean Office Action re Application No. KR 2008-0128377, dated May 8, 2015.

* cited by examiner

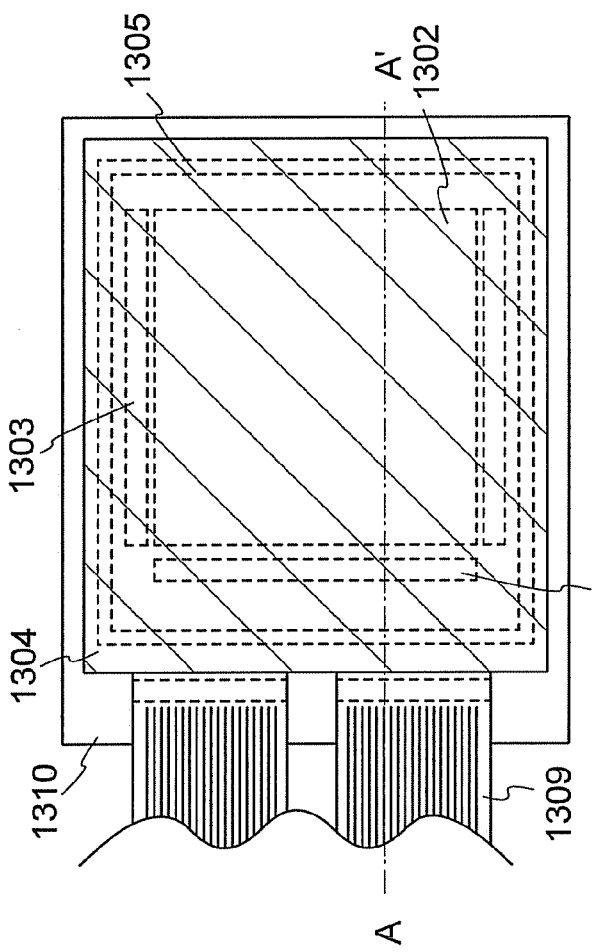
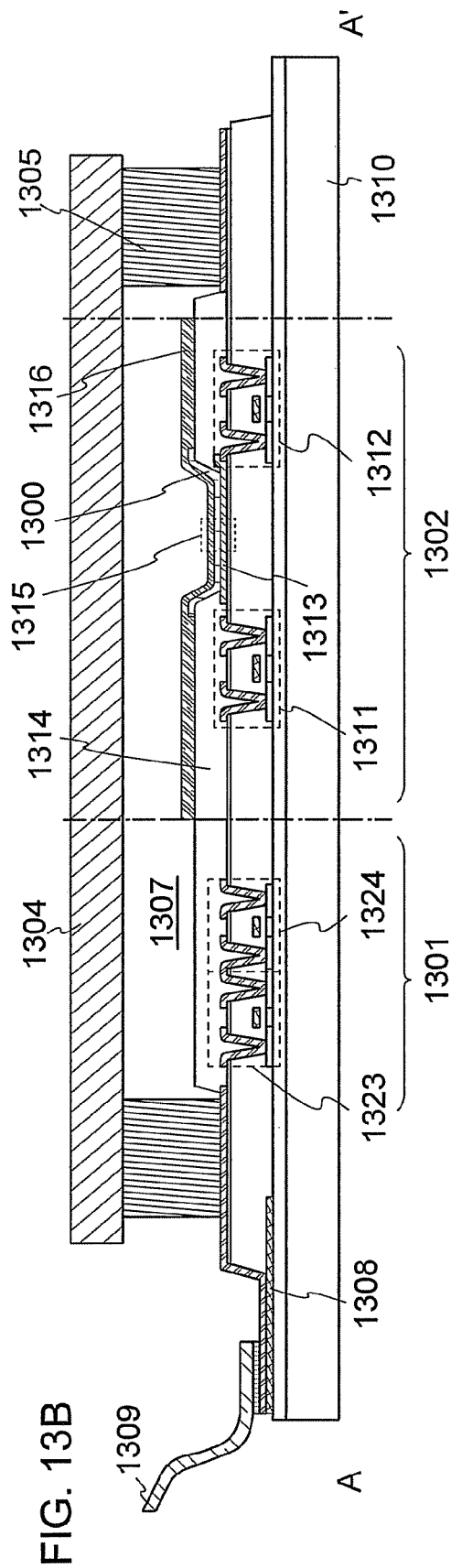
FIG. 13A
FIG. 13B

EVAPORATION DONOR SUBSTRATE, METHOD FOR MANUFACTURING THE SAME, AND METHOD FOR MANUFACTURING LIGHT-EMITTING DEVICE

BACKGROUND OF THE INVENTION

1. Field of the Invention

The present invention relates to an evaporation donor substrate used for deposition of materials that can be deposited by an evaporation method, a method for manufacturing the evaporation donor substrate, and a method for manufacturing a light-emitting device using the evaporation donor substrate.

2. Description of the Related Art

Light-emitting elements using an organic compound as a light emitter, which are characterized by thinness, lightweight, fast response, and direct current low voltage driving, have been expected to be applied to next-generation flat panel displays. In particular, display devices in which light-emitting elements are arranged in matrix have been considered to be superior to conventional liquid crystal display devices in terms of a wide viewing angle and good visibility.

It is considered that the light emission mechanism of a light-emitting element is as follows: when a voltage is applied between a pair of electrodes with an EL layer interposed therebetween, electrons injected from the cathode and holes injected from the anode are recombined in the light emission center of the EL layer to form molecular excitons, and energy is released to emit light when the molecular excitons relax to the ground state. A singlet excited state and a triplet excited state are known as the excited states, and it is thought that light emission can be obtained through either of the excited states.

An EL layer included in a light-emitting element has at least a light-emitting layer. In addition to the light-emitting layer, the EL layer can have stacked layers of structure including a hole-injecting layer, a hole-transporting layer, an electron-transporting layer, an electron-injecting layer, and the like.

EL materials for forming an EL layer are broadly classified into a low molecular (a monomer) material and a high molecular (a polymer) material. In general, a low molecular material is often deposited by an evaporation method and a high molecular material is often deposited by ink-jet or the like.

An evaporation apparatus that is used in an evaporation method includes a substrate holder onto which a substrate is mounted; a crucible (or an evaporation boat) containing an EL material, that is, an evaporation material; a heater for heating the EL material in the crucible; and a shutter for preventing the EL material from being scattered during sublimation. The EL material that is heated by the heater is sublimed and deposited on the substrate.

Note that in order to achieve uniform deposition, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition wall (bank) formed of an insulator between the pixels be large. Such needs are major problems in advancing miniaturization of display pixel pitches along with higher definition (an increase in the number of pixels) and reduction in size of a light-emitting device including a light-emitting element.

Therefore, in order to achieve higher definition and higher reliability of flat panel displays, it has been required to solve those problems as well as to achieve high productivity and cost reduction.

Thus, a method for forming an EL layer of a light-emitting element through laser thermal transfer has been proposed (see Reference 1: Japanese Published Patent Application No. 2006-309995). Disclosed in Reference 1 is a transfer substrate in which a photothermal conversion layer including a low reflective layer and a high reflective layer and a transfer layer are provided over a supporting substrate. Irradiation of such a transfer substrate with laser light allows the transfer layer to be transferred to an element forming substrate.

However, in the transfer substrate of Reference 1, the high reflective layer and the low reflective layer are stacked on one side of the substrate. Therefore, even with the use of the high reflective layer, some heat absorption cannot be avoided. Thus, when the energy of the laser light is large, not only a portion of the transfer layer over the low reflective layer but also a portion of the transfer layer over the high reflective layer may be transferred.

In addition, in the structure illustrated in FIG. 3 of Reference 1, as also described in paragraph [0041], the low reflective layer and the high reflective layer must be formed with no space therebetween, which requires highly accurate patterning.

Furthermore, in the structure illustrated in FIG. 7 of Reference 1, the low reflective layer is patterned, the high reflective layer is then formed over the entire surface, and after that, the transfer layer is formed. In this structure, heat from the low reflective layer that is heated by absorbing laser light is transferred to the transfer layer through the high reflective layer. Thus, not only a desired portion of the transfer layer but also a portion of the transfer layer around the desired portion may be transferred.

SUMMARY OF THE INVENTION

Thus, it is an object of the present invention to provide a method for easily forming a desired pattern over an evaporation donor substrate used for evaporation. By applying the present invention, the production cost of an evaporation donor substrate can be reduced; only a desired evaporation material can be evaporated in the case where deposition is performed by an evaporation method; the use efficiency of an evaporation material can be increased resulting in reduction in production cost; and an evaporation donor substrate can be easily manufactured resulting in reduction in production cost.

It is another object of the present invention to provide a method for manufacturing a light-emitting device using such an evaporation donor substrate, by which miniaturization of pixel pitches can be advanced along with higher definition (an increase in the number of pixels) and reduction in size of a light-emitting device.

An evaporation donor substrate in accordance with one aspect of the present invention includes a reflective layer that has an opening and is formed over a substrate, a thermal insulation layer that has a light-transmitting property and is separately (or detachedly) formed over the substrate and the reflective layer, a light absorption layer formed over the thermal insulation layer, and a material layer formed over the light absorption layer.

In the aforementioned structure, the thermal insulation layer has a transmittance of 60% or more, the reflective layer has a thickness of 1 μm to 2 μm, and the thermal insulation layer has a thickness of 10 nm to 1 μm.

An evaporation donor substrate in accordance with another aspect of the present invention includes a reflective layer and a thermal insulation layer that have an opening and are formed over a substrate, a light absorption layer that is separately (or detachedly) formed over the substrate and the thermal insulation layer, and a material layer formed over the light absorption layer.

In the aforementioned structure, the reflective layer has a thickness of 10 nm to 1 μm, and the thermal insulation layer has a thickness of 1 μm to 2 μm.

In each of the aforementioned structures, the reflective layer has a reflectance of 85% or more for light, and contains any of aluminum, silver, gold, platinum, copper, an alloy containing aluminum, and an alloy containing silver.

In each of the aforementioned structures, the thermal conductivity of a material used for the thermal insulation layer is lower than that of materials used for the reflective layer and the light absorption layer. The thermal insulation layer contains any of titanium oxide, silicon oxide, silicon nitride oxide, and zirconium oxide.

In each of the aforementioned structures, the light absorption layer has a reflectance of 70% or less for light, and has a thickness of 200 nm to 600 nm. Furthermore, the light absorption layer contains any of titanium nitride, tantalum nitride, a nitride of other metals, titanium, and carbon.

In each of the aforementioned structures, the material layer contains an organic compound. Note that the present invention includes the case where the material layer contains at least one of a light-emitting material and a carrier-transporting material.

A method for manufacturing an evaporation donor substrate in accordance with one aspect of the present invention is a method for manufacturing the aforementioned evaporation donor substrate. The method includes the steps of: forming a reflective layer having an opening over a substrate; forming a thermal insulation layer having a light-transmitting property separately (or detachedly) over the substrate and the reflective layer; forming a light absorption layer over the thermal insulation layer; and forming a material layer over the light absorption layer.

A method for manufacturing an evaporation donor substrate in accordance with another aspect of the present invention includes the steps of: forming a reflective layer over a substrate; forming a thermal insulation layer over the reflective layer; forming an opening in the reflective layer and the thermal insulation layer; forming a light absorption layer separately (or detachedly) over the substrate and the thermal insulation layer; and forming a material layer over the light absorption layer.

A method for manufacturing a light-emitting device in accordance with one aspect of the present invention is a method for manufacturing a light-emitting device using the aforementioned evaporation donor substrate of the present invention. The method includes the steps of: closely disposing a first substrate and a second substrate so that a deposition target surface of the second substrate faces a surface of the first substrate, over which a reflective layer having an opening, a thermal insulation layer that has a light-transmitting property and is separately formed to be in contact with the first substrate and the reflective layer, a light absorption layer formed to be in contact with the thermal insulation layer, and a material layer formed to be in contact with the light absorption layer are at least formed; irradiating the other surface of the first substrate with light; selectively heating a part of the material layer, which overlaps the opening in the reflective layer; and evaporating the part of the material layer onto the deposition target surface of the second substrate.

A method for manufacturing a light-emitting device in accordance with another aspect of the present invention includes the steps of: closely disposing a first substrate and a second substrate so that a surface of the second substrate, over which a first electrode is formed, faces a surface of the first substrate, over which a reflective layer having an opening, a thermal insulation layer that has a light-transmitting property and is separately formed to be in contact with the first substrate and the reflective layer, a light absorption layer formed to be in contact with the thermal insulation layer, and a material layer formed to be in contact with the light absorption layer are at least formed; irradiating the other surface of the first substrate with light; selectively heating a part of the material layer, which overlaps the opening in the reflective layer; and evaporating the part of the material layer onto a surface of the first electrode.

A method for manufacturing a light-emitting device in accordance with another aspect of the present invention is a method for manufacturing a light-emitting device using the aforementioned evaporation donor substrate of the present invention. The method includes the steps of: closely disposing a first substrate and a second substrate so that a deposition target surface of the second substrate faces a surface of the first substrate, over which a reflective layer and a thermal insulation layer that have an opening, a light absorption layer that is separately formed to be in contact with the first substrate and the thermal insulation layer, and a material layer formed to be in contact with the light absorption layer are at least formed; irradiating the other surface of the first substrate with light; selectively heating a part of the material layer, which overlaps the opening in the reflective layer; and evaporating the part of the material layer onto the deposition target surface of the second substrate.

A method for manufacturing a light-emitting device in accordance with another aspect of the present invention includes the steps of: closely disposing a first substrate and a second substrate so that a surface of the second substrate, over which a first electrode is formed, faces a surface of the first substrate, over which a reflective layer and a thermal insulation layer that have an opening, a light absorption layer that is separately formed to be in contact with the first substrate and the thermal insulation layer, and a material layer formed to be in contact with the light absorption layer are at least formed; irradiating the other surface of the first substrate with light; selectively heating a part of the material layer, which overlaps the opening in the reflective layer; and evaporating the part of the material layer onto a surface of the first electrode.

In each of the aforementioned structures, the light emitted to the first substrate is infrared light.

The present invention also covers an electronic appliance including a light-emitting device, as well as a light-emitting device including a light-emitting element. Accordingly, a light-emitting device in this specification refers to an image display device, a light-emitting device, and a light source (including an illumination device). In addition, the light-emitting device also refers to a module in which a light-emitting device is connected to a connector such as an flexible printed circuit (FPC), a tape automated bonding (TAB) tape, or a tape carrier package (TCP); a module in which a printed wiring board is provided on the tip of a TAB tape or a TCP; and a module in which an integrated circuit (IC) is directly mounted onto a light-emitting element by chip on glass (COG).

In an evaporation donor substrate of the present invention, films that are stacked to form the evaporation donor substrate have different thicknesses, so that the films are separately formed; thus, a desired pattern can be formed over the evaporation donor substrate. Accordingly, it is not necessary to perform a photolithography step that is generally required to form a pattern over an evaporation donor substrate, which results in reduction in production cost of the evaporation donor substrate.

In addition, by using the evaporation donor substrate of the present invention, the thickness of a film deposited on a deposition target substrate can be controlled by controlling the thickness of a material layer formed over the evaporation donor substrate. Therefore, the practitioner does not need to adjust the evaporation rate by using a thickness monitor, and thus the deposition process can be fully automated.

Furthermore, by using the evaporation donor substrate of the present invention, an evaporation material contained in the material layer that is formed over the evaporation donor substrate during deposition can be uniformly sublimed. Also in the case where the material layer contains a plurality of evaporation materials, a film containing the same evaporation materials in substantially the same weight ratio as the material layer can be deposited on a deposition target substrate. Accordingly, even in the case where a plurality of evaporation materials with different evaporation temperatures are used for deposition, by using the evaporation donor substrate of the present invention for the deposition, the evaporation rate of each co-evaporation material does not need to be controlled like co-evaporation. Therefore, without complicated control of the evaporation rate or the like, a desired layer containing different evaporation materials can be deposited easily and accurately.

Thus, in the method for manufacturing a light-emitting device of the present invention with the use of the aforementioned evaporation donor substrate, a flat and even film can be deposited and a minute pattern can be formed. Accordingly, a light-emitting device with high definition can be obtained, and further the characteristics of the light-emitting device can be improved.

Furthermore, in the method for manufacturing a light-emitting device of the present invention with the use of the aforementioned evaporation donor substrate, the use efficiency of an EL material can be increased. In addition, by using, for example, a lamp heater with high energy as a light source, deposition can be performed on a large area at a time, which results in reduction in production cost of the light-emitting device.

BRIEF DESCRIPTION OF THE DRAWINGS

In the accompanying drawings:

FIGS. 13A and 13B are diagrams illustrating an active matrix light-emitting device;

DETAILED DESCRIPTION OF THE INVENTION

Embodiment modes of the present invention will be described below in detail with reference to the drawings. Note that the present invention is not limited to the description given below, and modes and details of the present invention can be modified in various ways without departing from the spirit and scope of the present invention. Accordingly, the present invention should not be construed as being limited to the description of the embodiment modes given below.

Embodiment Mode 1

In this embodiment mode, a method for manufacturing an evaporation donor substrate in accordance with the present invention will be described.

Figure 1A:
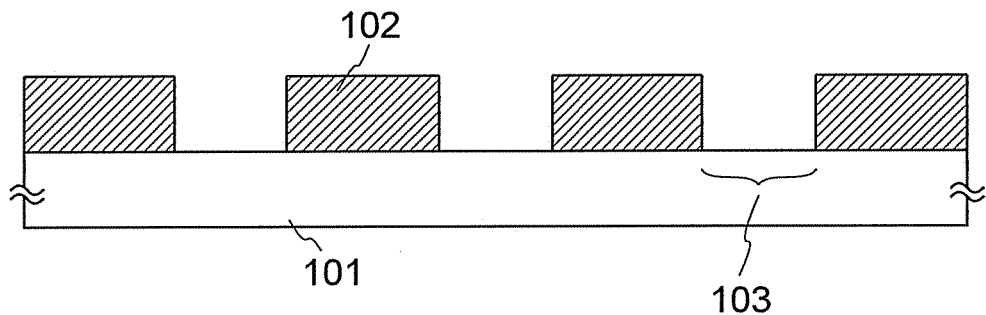
FIGS. 1A to 1D are diagrams illustrating a method for manufacturing an evaporation donor substrate of the present invention.

First, as illustrated in FIG. 1A, a reflective layer 102 is formed over a first substrate 101 that is a supporting substrate. The reflective layer 102 is a layer for partially reflecting the irradiation light so that a part of a light absorption layer over an evaporation donor substrate is selectively irradiated with light during evaporation. Therefore, the reflective layer 102 is preferably formed of a material having a high reflectance for the irradiation light. Specifically, the reflective layer 102 preferably has a reflectance of 85% or more, and more preferably, a reflectance of 90% or more for the irradiation light.

As a material for the reflective layer 102, for example, silver, gold, platinum, copper, an alloy containing aluminum, or an alloy containing silver can be used. In particular, an aluminum-titanium alloy, an aluminum-neodymium alloy, or a silver-neodymium alloy has a high reflectance for light in the infrared region (a wavelength of 800 nm or more) and thus is suitably used as a material for the reflective layer. Specifically, an aluminum film or an aluminum-titanium alloy film with a thickness of 400 nm has a reflectance of 85% or more for light in the infrared region (a wavelength of 800 nm to 2500 nm). A material such as molybdenum or tungsten that is not described above has a low reflectance for light having a wavelength of 800 nm to 900 nm. Such a material is suitable as a material for the light absorption layer described later in the present invention, and can also be used as a material for the reflective layer 102 in the case where the irradiation light has a wavelength of 2000 nm to 2500 nm because the material has a high reflectance of 85% or more for the irradiation light.

Since a kind of material that is suitable for the reflective layer 102 thus varies depending on the wavelength of the irradiation light, the material of the reflective layer 102 needs to be selected as appropriate.

Note that the reflective layer 102 can be formed by a variety of methods. For example, the reflective layer 102 can be formed by sputtering, electron beam evaporation, or vacuum evaporation. It is preferable that the thickness of the reflective layer 102 be 1 μm or more in order to form a pattern of functional layers (a thermal insulation layer, a light absorption layer, and a material layer) that are to be formed later. With a thickness of 1 μm or more, transmission of the irradiation light through the reflective layer can be suppressed, and further the pattern of functional layers can be formed.

An opening 103 is formed in the reflective layer 102. The opening 103 can be formed by a variety of methods, but is preferably formed by dry etching. By use of dry etching, the opening 103 has a sharper sidewall and a minute pattern can be formed.

Figure 1B:
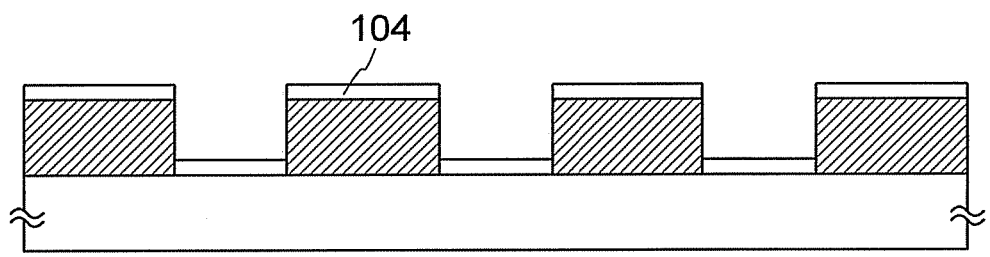

Next, as illustrated in FIG. 1B, a thermal insulation layer 104 is formed. Due to the large thickness of the reflective layer 102, the thermal insulation layer 104 is formed separately over the reflective layer 102 and in the opening 103 in the reflective layer 102 over the substrate 101. Accordingly, the photolithography step for separately forming the thermal insulation layer 104 can be omitted.

The thermal insulation layer 104 is a layer for preventing heat from being conducted to the light absorption layer and the material layer that are to be formed later over the reflective layer 102, if the light emitted during evaporation is partially converted into heat by the reflective layer 102 and remains in the reflective layer 102. Note that in this embodiment mode, a light absorption layer 105 that is formed in the opening 103 needs to be irradiated with light transmitted through the opening 103 in the reflective layer 102. Therefore, the thermal insulation layer 104 is required to have a light-transmitting property. Thus, the thermal insulation layer 104 of this embodiment mode needs to be formed of a material having a high light transmittance as well as a low thermal conductivity. In addition, the thermal insulation layer 104 needs to be formed of a material having a lower thermal conductivity than materials forming the reflective layer 102 and the light absorption layer 105. Specifically, the thermal insulation layer 104 is preferably formed of a material having a thermal conductivity of 10 w·m$^{-1}$·k$^{-1}$ or less and a transmittance of 60% or more for light in the near-infrared region (a wavelength of 700 nm to 2500 nm).

As a material for the thermal insulation layer 104, for example, titanium oxide, silicon oxide, silicon nitride oxide, zirconium oxide, or silicon carbide can be used.

Note that the thermal insulation layer 104 can be formed by a variety of methods. For example, the thermal insulation layer 104 can be formed by sputtering, electron beam evaporation, vacuum evaporation, or CVD. It is preferable that the thickness of the thermal insulation layer 104 be 10 nm to 1 μm, and more preferably, 100 nm to 600 nm, although it depends on a material. When the thermal insulation layer 104 has a thickness of 10 nm to 1 μm, it is possible not only to transmit the irradiation light through the opening 103 in the reflective layer 102, but also to prevent heat remaining in the reflective layer 102 in the light irradiation from being conducted to the light absorption layer and the material layer that are formed at a position overlapping the reflective layer 102.

Figure 1C:
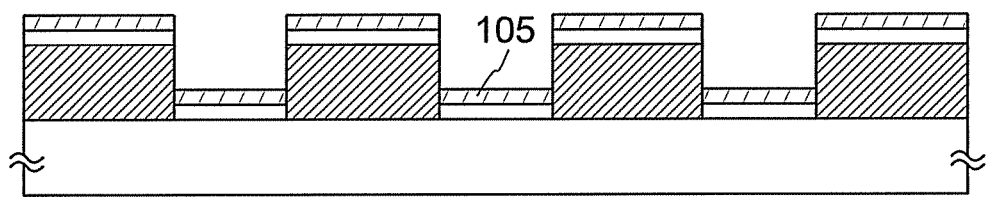

Next, as illustrated in FIG. 1C, the light absorption layer 105 is formed. Due to the large thickness of the reflective layer 102, the light absorption layer 105 is formed separately over the reflective layer 102 and in the opening 103 in the reflective layer 102. Accordingly, the photolithography step for separately forming the light absorption layer 105 can be omitted.

The light absorption layer 105 absorbs light that is emitted during evaporation. Therefore, it is preferable that the light absorption layer 105 be formed of a material having low reflectance and high absorptance for the irradiation light. Specifically, it is preferable that the light absorption layer 105 have a reflectance of 70% or less for the irradiation light.

As a material for the light absorption layer 105, for example, molybdenum, tantalum nitride, titanium, or tungsten is preferably used for light having a wavelength of 800 nm. Moreover, for light having a wavelength of 1300 nm, tantalum nitride, titanium, or the like is preferably used. Note that the light absorption layer 105 is not limited to a single layer and may include a plurality of layers.

Since a kind of material that is suitable for the light absorption layer 105 thus varies depending on the wavelength of the irradiation light, the material of the light absorption layer 105 needs to be selected as appropriate.

Note that the light absorption layer 105 can be formed by a variety of methods. For example, the light absorption layer 105 can be formed by sputtering, electron beam evaporation, or vacuum evaporation.

It is preferable that the light absorption layer 105 have such a thickness that the irradiation light is not transmitted therethrough (preferably, a thickness of 100 nm to 2 μm), although it depends on a material. In particular, with a thickness of 200 nm to 600 nm, the light absorption layer 105 can efficiently absorb the irradiation light to generate heat. In addition, the light absorption layer 105 with a thickness of 200 nm to 600 nm allows highly accurate deposition on a deposition target substrate.

The light absorption layer 105 may partially transmit the irradiation light as long as the evaporation material contained in the material layer that is to be formed later can be heated to the sublimation temperature. Note that when the light absorption layer 105 partially transmits the irradiation light, it is necessary to use a material that is not decomposed by light as the evaporation material contained in the material layer.

Note that the greater the difference in reflectance between the reflective layer 102 and the light absorption layer 105 is, the more preferable it is. Specifically, the difference in reflectance for the wavelength of the irradiation light is preferably 25% or more, and more preferably, 30% or more.

Figure 1D:
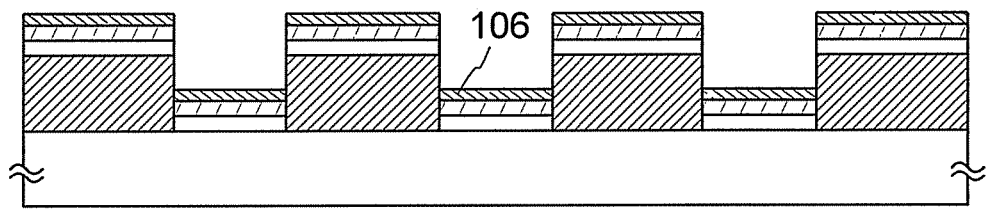

Next, as illustrated in FIG. 1D, a material layer 106 is formed. The material layer 106 is formed to contain the evaporation material that is evaporated onto a deposition target substrate. When the material layer 106 is irradiated with light during evaporation, the evaporation material contained in the material layer 106 is heated to be sublimed and evaporated onto the deposition target substrate.

Note that a variety of materials can be used as the evaporation material contained in the material layer 106 regardless of whether they are organic compounds or inorganic compounds, as long as the materials can be evaporated. In the case of forming an EL layer of a light-emitting element as described in this embodiment mode, a material that can be evaporated to form an EL layer is used. For example, an organic compound for forming an EL layer, such as a light-emitting material or a carrier-transporting material, or an inorganic compound used for an electrode or the like of a light-emitting element, such as a metal oxide, a metal nitride, a metal halide, or an elementary substance of metal can be used. Details of the materials that can be evaporated to form an EL layer are given not here but in Embodiment Mode 7; therefore, Embodiment Mode 7 is referred to for details.

The material layer 106 may contain a plurality of materials. The material layer 106 may be a single layer or a plurality of stacked layers. Accordingly, by stacking a plurality of layers each containing an evaporation material, co-evaporation is also possible. In the case where the material layer 106 has a stacked-layer structure, it is preferable that the layers be stacked so that an evaporation material having a low sublimation temperature (or a material that can be evaporated at a low temperature) be contained in a layer near the first substrate. Such a structure allows efficient evaporation using the material layer 106 that has a stacked-layer structure.

The material layer 106 is formed by a variety of methods. For example, a wet method such as spin coating, spray coating, ink-jet, dip coating, casting, die coating, roll coating, blade coating, bar coating, gravure coating, or printing can be used. Alternatively, a dry method such as vacuum evaporation or sputtering can be used.

In the case of forming the material layer 106 by a wet method, a desired evaporation material may be dissolved or dispersed in a solvent, and a solution or a dispersion solution may be adjusted. There is no particular limitation on the solvent as long as an evaporation material can be dissolved or dispersed therein and the solvent does not react with the evaporation material. Examples of the solvent are as follows: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of those solvents may also be used. By using a wet method, material use efficiency can be increased, resulting in reduction in production cost.

In such a manner, the evaporation donor substrate of the present invention can be formed.

In the evaporation donor substrate of the present invention, films that are stacked to form the evaporation donor substrate have different thicknesses, so that the films are separately formed; thus, a desired pattern can be formed over the evaporation donor substrate. Accordingly, it is not necessary to perform a photolithography step that is generally required to form a pattern over an evaporation donor substrate, which results in reduction in production cost of the evaporation donor substrate.

In addition, by using the evaporation donor substrate of the present invention, the thickness of a film deposited on a deposition target substrate can be controlled by controlling the thickness of the material layer formed over the evaporation donor substrate. Therefore, the practitioner does not need to adjust the evaporation rate by using a thickness monitor, and thus the deposition process can be fully automated.

Furthermore, by using the evaporation donor substrate of the present invention, an evaporation material contained in the material layer that is formed over the evaporation donor substrate during deposition can be uniformly sublimed. Also in the case where the material layer contains a plurality of evaporation materials, a film containing the same evaporation materials in substantially the same weight ratio as the material layer can be deposited on a deposition target substrate. Accordingly, even in the case where a plurality of evaporation materials with different evaporation temperatures are used for deposition, by using the evaporation donor substrate of the present invention for the deposition, the evaporation rate of each evaporation material does not need to be controlled like co-evaporation. Therefore, without complicated control of the evaporation rate or the like, a desired layer containing different evaporation materials can be deposited easily and accurately.

Embodiment Mode 2

In this embodiment mode, an evaporation donor substrate having a different structure from that of the evaporation donor substrate described in Embodiment Mode 1 will be described with reference to FIGS. 2A to 2D.

Figure 2A:
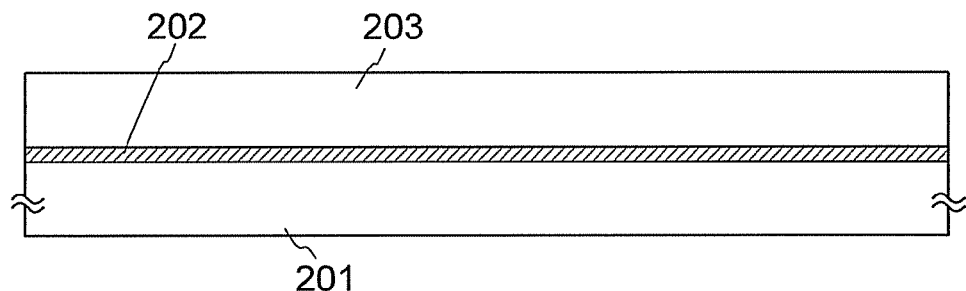
FIGS. 2A to 2D are diagrams illustrating a method for manufacturing an evaporation donor substrate of the present invention.

First, as illustrated in FIG. 2A, a reflective layer 202 is formed over a first substrate 201 that is a supporting substrate. The reflective layer 202 is a layer for partially reflecting the irradiation light so that a part of a light absorption layer over an evaporation donor substrate is selectively irradiated with light during evaporation. Therefore, the reflective layer 202 is preferably formed of a material having a high reflectance for the irradiation light. Specifically, the reflective layer 202 preferably has a reflectance of 85% or more, and more preferably, a reflectance of 90% or more for the irradiation light.

As a material for the reflective layer 202, for example, silver, gold, platinum, copper, an alloy containing aluminum, or an alloy containing silver can be used. In particular, an aluminum-titanium alloy, an aluminum-neodymium alloy, or a silver-neodymium alloy has a high reflectance for light in the infrared region (a wavelength of 800 nm or more) and thus is suitably used as a material for the reflective layer. Specifically, an aluminum film or an aluminum-titanium alloy film with a thickness of 400 nm has a reflectance of 85% or more for light in the infrared region (a wavelength of 800 nm to 2500 nm). A material such as molybdenum or tungsten that is not described above has a low reflectance for light having a wavelength of 800 nm to 900 nm. Such a material is suitable as a material for the light absorption layer described later in the present invention, and can also be used as a material for the reflective layer 202 in the case where the irradiation light has a wavelength of 2000 nm to 2500 nm because the material has a high reflectance of 85% or more for the irradiation light.

Since a kind of material that is suitable for the reflective layer 202 thus varies depending on the wavelength of the irradiation light, the material of the reflective layer 202 needs to be selected as appropriate.

Note that the reflective layer 202 can be formed by a variety of methods. For example, the reflective layer 202 can be formed by sputtering, electron beam evaporation, or vacuum evaporation. It is preferable that the thickness of the reflective layer 202 be 10 nm to 1 μm, and more preferably, 100 nm to 600 nm, although it depends on a material. With a thickness of 10 nm to 1 μm, transmission of the irradiation light through the reflective layer can be suppressed.

Next, a thermal insulation layer 203 is formed over the reflective layer 202. The thermal insulation layer 203 is a layer for preventing heat from being conducted to the light absorption layer and a material layer that are to be formed later over the reflective layer 202, if the light emitted during evaporation is partially converted into heat by the reflective layer 202 and remains in the reflective layer 202. Therefore, the thermal insulation layer 203 in Embodiment Mode 2 needs to be formed of a material having a low thermal conductivity. In addition, the thermal insulation layer 203 needs to be formed of a material having a lower thermal conductivity than materials forming the reflective layer 202 and the light absorption layer that is to be formed later. Specifically, the thermal insulation layer 203 is preferably formed of a material having a thermal conductivity of 10 $w \cdot m^{-1} \cdot k^{-1}$ or less and a transmittance of 60% or more for light in the near-infrared region (a wavelength of 700 nm to 2500 nm).

As a material for the thermal insulation layer 203, for example, titanium oxide, silicon oxide, silicon nitride oxide, zirconium oxide, or silicon carbide can be used.

Note that the thermal insulation layer 203 can be formed by a variety of methods. For example, the thermal insulation layer 203 can be formed by sputtering, electron beam evaporation, vacuum evaporation, or CVD. It is preferable that the thickness of the thermal insulation layer 203 be 1 µm to 2 µm in order to form a pattern of functional layers (the thermal insulation layer, the light absorption layer, and the material layer) that are to be formed later. With a thickness of 1 µm to 2 µm, it is possible not only to form the pattern of functional layers, but also to prevent heat remaining in the reflective layer 202 in the light irradiation from being conducted to the light absorption layer and the material layer that are formed at a position overlapping the reflective layer 202.

Figure 2B:
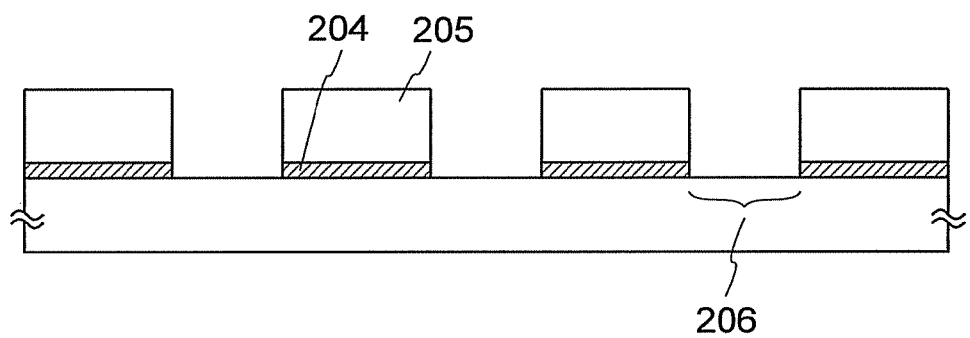
Figure 2C:
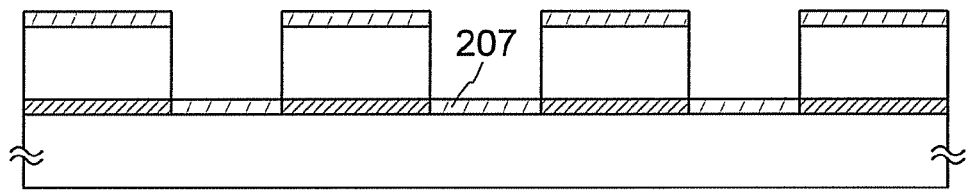

After the reflective layer 202 and the thermal insulation layer 203 are stacked, an opening 206 is formed as illustrated in FIG. 2B, whereby a reflective layer 204 and a thermal insulation layer 205 each are separately formed. The opening 206 can be formed by a variety of methods, but is preferably formed by dry etching. By use of dry etching, the opening 206 has a sharper sidewall and a minute pattern can be formed.

Next, a light absorption layer 207 is formed. Due to the large thickness of the thermal insulation layer 203, the light absorption layer 207 is formed separately over the thermal insulation layer 203, and in the opening 206 in the reflective layer 202 and the thermal insulation layer 203 over the substrate 201. Accordingly, the photolithography step for separately forming the light absorption layer 207 can be omitted.

The light absorption layer 207 absorbs light that is emitted during evaporation. Therefore, it is preferable that the light absorption layer 207 be formed of a material having low reflectance and high absorptance for the irradiation light. Specifically, it is preferable that the light absorption layer 207 have a reflectance of 70% or less for the irradiation light.

As a material for the light absorption layer 207, for example, molybdenum, tantalum nitride, titanium, or tungsten is preferably used for light having a wavelength of 800 nm. Meanwhile, for light having a wavelength of 1300 nm, for example, tantalum nitride or titanium is preferably used. Note that the light absorption layer 207 is not limited to a single layer and may include a plurality of layers.

Since a kind of material that is suitable for the light absorption layer 207 thus varies depending on the wavelength of the irradiation light, the material of the light absorption layer 207 needs to be selected as appropriate.

Note that the light absorption layer 207 can be formed by a variety of methods. For example, the light absorption layer 207 can be formed by sputtering, electron beam evaporation, or vacuum evaporation.

It is preferable that the light absorption layer 207 have such a thickness that the irradiation light is not transmitted therethrough (preferably, a thickness of 100 nm to 2 µm), although it depends on a material. In particular, with a thickness of 200 nm to 600 nm, the light absorption layer 207 can efficiently absorb the irradiation light to generate heat. In addition, the light absorption layer 207 with a thickness of 200 nm to 600 nm allows highly accurate deposition on a deposition target substrate.

The light absorption layer 207 may partially transmit the irradiation light as long as the evaporation material contained in the material layer that is to be formed later can be heated to the sublimation temperature. Note that when the light absorption layer 207 partially transmits the irradiation light, it is necessary to use a material that is not decomposed by light as the evaporation material contained in the material layer.

Figure 2D:
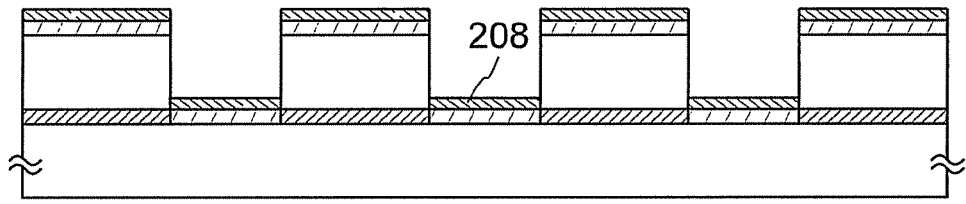

Next, as illustrated in FIG. 2D, a material layer 208 is formed. The material layer 208 contains the evaporation material that is evaporated onto a deposition target substrate. When the material layer 208 is irradiated with light, the evaporation material contained in the material layer 208 is heated to be sublimed and evaporated onto the deposition target substrate.

Note that a variety of materials can be used as the evaporation material contained in the material layer 208 regardless of whether they are organic compounds or inorganic compounds, as long as the materials can be evaporated. In the case of forming an EL layer of a light-emitting element as described in this embodiment mode, a material that can be evaporated to form an EL layer is used. For example, an organic compound to form an EL layer, such as a light-emitting material or a carrier-transporting material, or an inorganic compound used for an electrode or the like of a light-emitting element, such as a metal oxide, a metal nitride, a metal halide, or an elementary substance of metal can be used. Details of the materials that can be evaporated to form an EL layer are given not here but in Embodiment Mode 7; therefore, Embodiment Mode 7 is referred to for details.

The material layer 208 may contain a plurality of materials. The material layer 208 may be a single layer or a plurality of stacked layers. Accordingly, by stacking a plurality of layers each containing an evaporation material, co-evaporation is also possible. In the case where the material layer 208 has a stacked-layer structure, it is preferable that the layers be stacked so that an evaporation material having a low sublimation temperature (or a material that can be evaporated at a low temperature) be contained in a layer near the first substrate. Such a structure allows efficient evaporation using the material layer 208 that has a stacked-layer structure.

The material layer 208 is formed by a variety of methods. For example, a wet method such as spin coating, spray coating, ink-jet, dip coating, casting, die coating, roll coating, blade coating, bar coating, gravure coating, or printing can be used. Alternatively, a dry method such as vacuum evaporation or sputtering can be used.

In the case of forming the material layer 208 by a wet method, a desired evaporation material may be dissolved or dispersed in a solvent, and a solution or a dispersion solution may be adjusted. There is no particular limitation on the solvent as long as an evaporation material can be dissolved or dispersed therein and the solvent does not react with the evaporation material. Examples of the solvent are as follows: halogen-based solvents such as chloroform, tetra chloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of those solvents may also be used. By using a wet method, material use efficiency can be increased, resulting in reduction in production cost.

In such a manner, the evaporation donor substrate of the present invention can be formed.

In the evaporation donor substrate of the present invention, films that are stacked to form the evaporation donor substrate have different thicknesses, so that the films are separately formed; thus, a desired pattern can be formed over the evaporation donor substrate. Accordingly, it is not necessary to perform a photolithography step that is generally required to form a pattern over an evaporation donor substrate, which results in reduction in production cost of the evaporation donor substrate.

In addition, by using the evaporation donor substrate of the present invention, the thickness of a film deposited on a deposition target substrate can be controlled by controlling the thickness of the material layer formed over the evaporation donor substrate. Therefore, the practitioner does not need to adjust the evaporation rate by using a thickness monitor, and thus the deposition process can be fully automated.

Furthermore, by using the evaporation donor substrate of the present invention, an evaporation material contained in the material layer that is formed over the evaporation donor substrate during deposition can be uniformly sublimed. Also in the case where the material layer contains a plurality of evaporation materials, a film containing the same evaporation materials in substantially the same weight ratio as the material layer can be deposited on a deposition target substrate. Accordingly, even in the case where a plurality of evaporation materials with different evaporation temperatures are used for deposition, by using the evaporation donor substrate of the present invention for the deposition, the evaporation rate of each evaporation material does not need to be controlled like co-evaporation. Therefore, without complicated control of the evaporation rate or the like, a desired layer containing different evaporation materials can be deposited easily and accurately.

Embodiment Mode 3

In this embodiment mode, a deposition method using an evaporation donor substrate of the present invention will be described. Note that described in this embodiment mode is a case where an EL layer of a light-emitting element is formed using the evaporation donor substrate shown in Embodiment Mode 1. The deposition method described in this embodiment mode may also be realized using the evaporation donor substrate shown in Embodiment Mode 2.

Figure 3A:
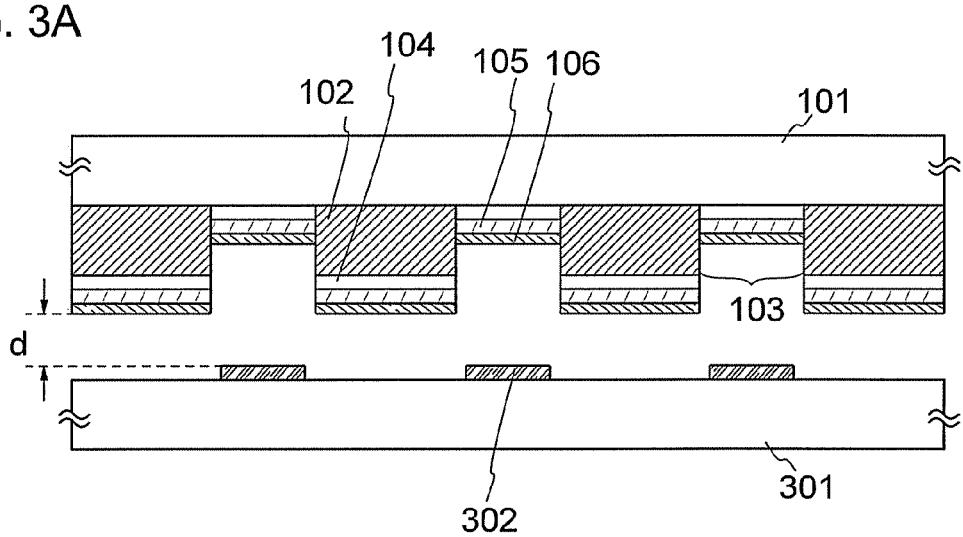
FIGS. 3A to 3C are diagrams illustrating an evaporation donor substrate and a deposition method of the present invention.

As illustrated in FIG. 3A, the reflective layer 102 is formed on the first substrate 101 that is a supporting substrate. Note that the reflective layer 102 includes the opening 103. The thermal insulation layer 104 is formed separately on the reflective layer 102 and in the opening 103 in the reflective layer 102. The light absorption layer 105 is formed on the thermal insulation layer 104.

The material layer 106 containing an evaporation material is formed on the light absorption layer 105. In FIG. 3A, due to the large thickness of the reflective layer 102, the thermal insulation layer 104, the light absorption layer 105, and the material layer 106 each are separately formed on the reflective layer 102 and in the opening 103 in the reflective layer 102.

Note that in the present invention, since light emitted to the first substrate 101 for evaporation of the evaporation material in the material layer 106 needs to be transmitted through the first substrate 101, the first substrate 101 preferably has a high light transmittance. Specifically, when lamp light or laser light is used as the irradiation light, a substrate that transmits lamp light or laser light is preferably used as the first substrate 101. In addition, the first substrate 101 is preferably formed of a material having a low thermal conductivity. With the substrate having a low thermal conductivity, heat obtained from the irradiation light can be efficiently used for evaporation. As the first substrate 101, for example, a glass substrate, a quartz substrate, or a plastic substrate containing an inorganic material can be used.

Then, a second substrate 301 that is a deposition target substrate is disposed so as to face a surface of the substrate 101, on which the reflective layer 102, the thermal insulation layer 104, the light absorption layer 105, and the material layer 106 are formed. The second substrate 301 is a deposition target substrate on which a desired layer is deposited through evaporation treatment. Note that described here is the case where an EL layer of a light-emitting element is formed using the evaporation donor substrate of the present invention; thus, a first electrode 302 that is to be one of the electrodes of the light-emitting element is formed over the second substrate 301. Then, the first substrate 101 and the second substrate 301 are disposed to face each other in proximity; specifically, they are disposed close to each other so that the distance d between the surface of the material layer 106 of the first substrate 101 and the surface of the second substrate 301 (specifically, the surface of the first electrode 302) is 0 mm to 2 mm, preferably 0 mm to 0.05 mm, and more preferably 0 mm to 0.01 mm.

Figure 4A:
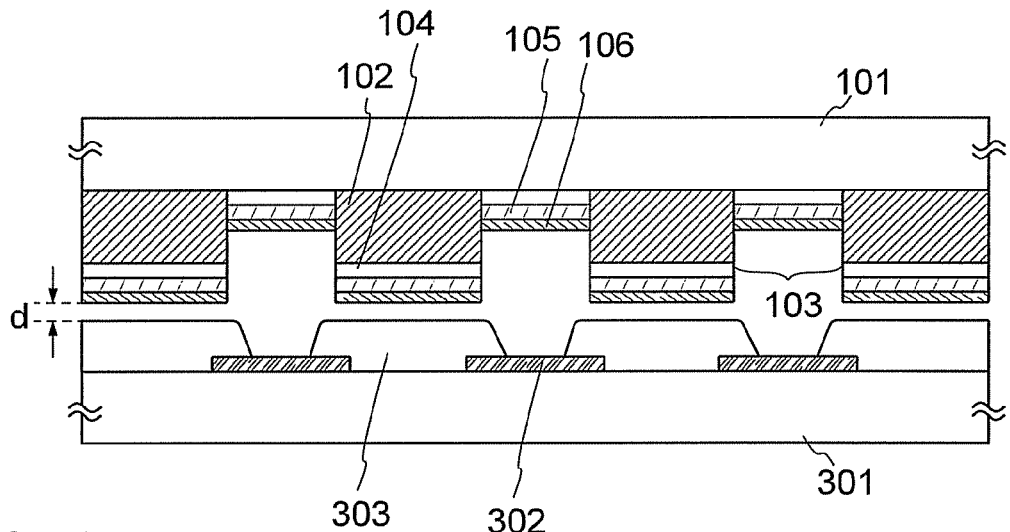
FIGS. 4A to 4C are diagrams illustrating an evaporation donor substrate and a deposition method of the present invention.

Note that the distance d is defined as the distance between the surface of the material layer 106 of the first substrate 101 and the surface of the second substrate 301. In the case where the first electrode 302 and an insulator 303 formed to cover the edges of the first electrode 302 are formed over the second substrate 301 as illustrated in FIG. 4A, the distance d is defined as the distance between the surface of the material layer 106 on the first substrate 101 and the surface of the insulator 303 formed over the second substrate 301. If the surface of the material layer 106 on the first substrate 101 or the outermost surface of a layer formed over the second substrate 301 has projections and depressions, the distance d is defined as the shortest distance between the surface of the material layer 106 on the first substrate 101 and the outermost surface of the layer formed over the second substrate 301.

Figure 3B:
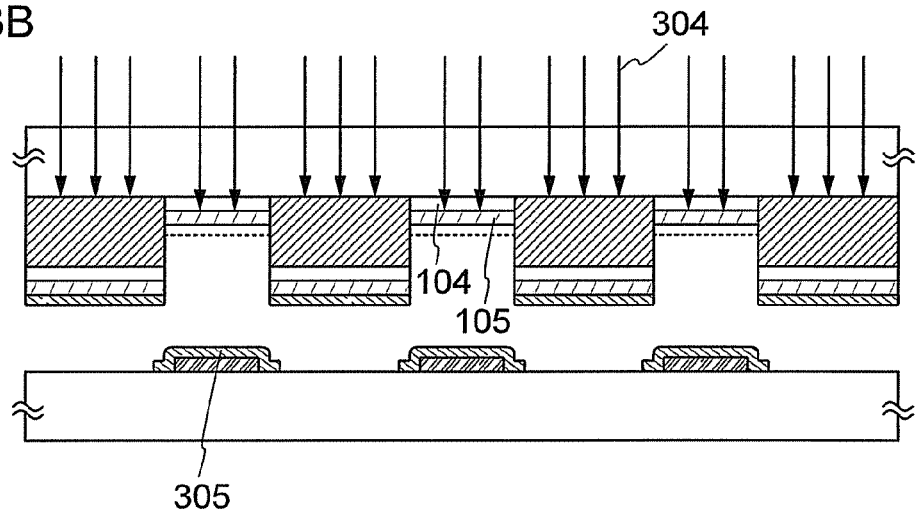

Then, as illustrated in FIG. 3B, a rear surface of the first substrate 101 (the surface on which the reflective layer 102, the thermal insulation layer 104, the light absorption layer 105, and the material layer 106 are not formed) is irradiated with light 304. At this time, the light that is emitted to the reflective layer 102 on the first substrate 101 is reflected while the light that is emitted to the opening 103 in the reflective layer 102 is transmitted through the thermal insulation layer 104 to be absorbed by the light absorption layer 105. The light absorption layer 105 absorbs light to generate heat and provides the heat to the evaporation material contained in the material layer 106 to sublime the evaporation material. Then, the evaporation material is evaporated onto the first electrode 302 over the second substrate 301. Thus, an EL layer 305 of a light-emitting element is formed over the second substrate 301.

Note that it is preferable that the irradiation light 304 be infrared light (a wavelength of 800 nm or more). The use of infrared light allows efficient thermal conversion in the light absorption layer 105, which leads to efficient sublimation of the evaporation material.

In the present invention, the material layer 106 is heated not with radiation heat from light emitted from a light source but heat provided by the light absorption layer 105 that absorbs light from a light source. Therefore, the light irradiation time is preferably set to be short so that an area of the material layer 106, which is heated, is not enlarged due to conduction of heat in a surface direction from a part of the light absorption layer 105, which is irradiated with light, to a part of the light absorption layer 105, which is not irradiated with light. For example, in the case where a halogen lamp is used as the light source, the evaporation material contained in the material layer 106 can be evaporated by keeping 300° C. to 800° C. for about 7 seconds to 15 seconds.

A variety of light sources can be used as a light source for emitting the light 304. For example, when a lamp is used as the light source, discharge lamps such as a flash lamp (such as a xenon flash lamp or krypton flash lamp), a xenon lamp, or a metal halide lamp, or exothermic lamps such as a halogen lamp or a tungsten lamp can be used. With a flash lamp, very high-intensity light can be repeatedly emitted in a short time (0.1 msec to 10 msec) to a large area; thus, heating can be performed uniformly and efficiently regardless of the area of the first substrate. In addition, heating of the first substrate can also be controlled by changing the time interval of light emission. Furthermore, a flash lamp emits light for a short time; thus, thermal conduction to the counter substrate can be suppressed.

A laser may also be used as a light source, as an alternative to a lamp. As the laser, one or more of the following can be used: a gas laser such as an Ar laser, a Kr laser, or an excimer laser; a laser of which medium is single crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ that is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When a solid state laser whose laser medium is solid is used, there are advantages in that maintenance-free condition can be maintained for a long time and output power is relatively stable.

It is preferable that evaporation by light irradiation be performed in a reduced pressure atmosphere. Accordingly, it is preferable that the deposition chamber have a pressure of $5 \times 10^{-3}$ Pa or less, and more preferably $10^{-6}$ Pa to $10^{-4}$ Pa.

Figure 3C:
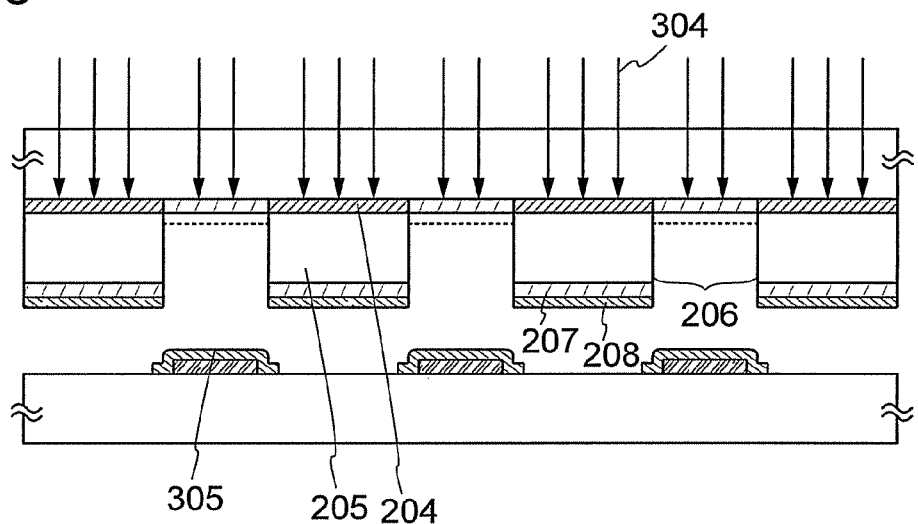

The evaporation donor substrate of the present invention may have the structure described in Embodiment Mode 2 with reference to FIG. 3C, as an alternative to the structure described in Embodiment Mode 1 with reference to FIG. 3A. The structure illustrated in FIG. 3C is such that the reflective layer 202 and the thermal insulation layer 203 are formed in order over the first substrate 201, the opening 206 is formed in the reflective layer 202 and the thermal insulation layer 203 to form the reflective layer 204 and the thermal insulation layer 205, and then the light absorption layer 207 and the material layer 208 are stacked in order. Note that the thermal insulation layer 203 has a large thickness in the structure illustrated in FIG. 3C; therefore, in light irradiation for evaporation, heat can be prevented from being conducted to a part of the light absorption layer 207 and a part of the material layer 208, which are formed at a position overlapping the reflective layer 204. Accordingly, it is possible to prevent deformation of a deposition pattern on the deposition target surface, which is generated because heat is conducted to a part of the material layer 208, which is formed at a position overlapping the reflective layer 204. In addition, the distance between the light absorption layer 207 formed in the opening 206 and the second substrate 301 can be maintained, and it is thus possible to prevent deposition defects caused by the second substrate 301 being heated by heat from the light absorption layer 207. Furthermore, since the direction in which the material is evaporated onto the second substrate 301 from the material layer 208 can be controlled, deformation of a deposition pattern on the deposition target surface can be prevented.

Figure 4B:
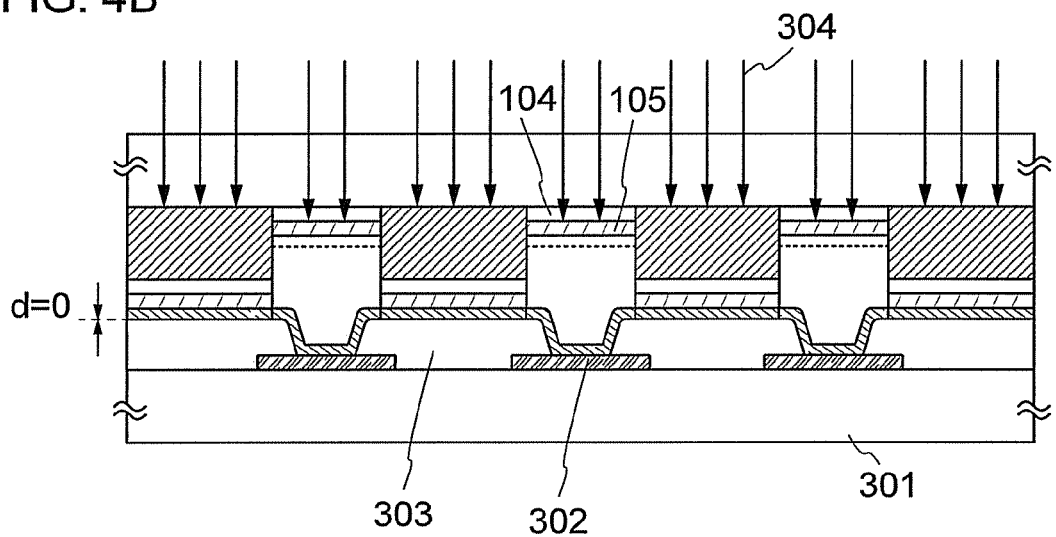
Figure 4C:
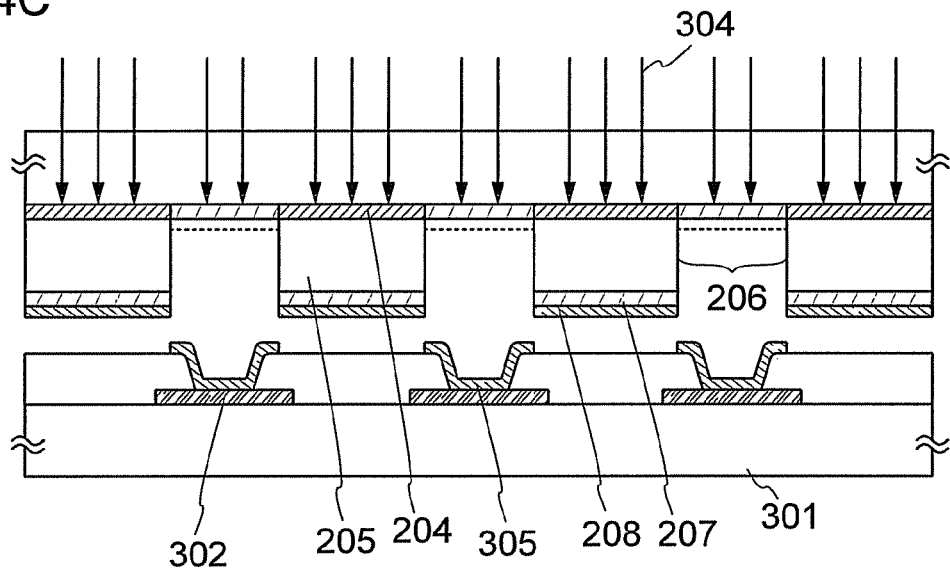

Alternatively, the distance d between the first substrate 101 and the second substrate 301 may be set to 0 mm as illustrated in FIG. 4B. That is, FIG. 4B illustrates a case where the surface of the insulator 303 formed over the second substrate 301 is in contact with a part of the material layer 106, which is formed at a position overlapping the reflective layer 102 on the first substrate 101 and is not evaporated. When the distance d is thus reduced, excessive loss of material can be prevented, resulting in increase in material use efficiency. Accordingly, as illustrated in FIG. 4C, the EL layer 305 of the light-emitting element can be accurately formed over the second substrate 301.

In this embodiment mode, the case where the second substrate 301 is positioned below the first substrate 101 is described; however, the present invention is not limited to this case. The orientation of the substrates can be determined as appropriate.

In the deposition method using the evaporation donor substrate of the present invention, the thickness of a film deposited on a deposition target substrate can be controlled by controlling the thickness of the material layer formed over the evaporation donor substrate. Therefore, the practitioner does not need to adjust the evaporation rate by using a thickness monitor, and thus the deposition process can be fully automated.

In addition, in the deposition method using the evaporation donor substrate of the present invention, an evaporation material contained in the material layer that is formed over the evaporation donor substrate during deposition can be uniformly sublimed. Also in the case where the material layer contains a plurality of evaporation materials, a film containing the same evaporation materials in substantially the same weight ratio as the material layer can be deposited on a deposition target substrate. Accordingly, even in the case where a plurality of evaporation materials with different evaporation temperatures are used for deposition, by using the evaporation donor substrate of the present invention for the deposition, the evaporation rate of each evaporation material does not need to be controlled like co-evaporation. Therefore, without complicated control of the evaporation rate or the like, a desired layer containing different evaporation materials can be deposited easily and accurately.

Furthermore, in the deposition method using the evaporation donor substrate of the present invention, a flat and even film can be deposited and a minute pattern can be formed. Accordingly, a light-emitting device with high definition can be obtained, and further the characteristics of the light-emitting device can be improved. The use efficiency of an EL material can also be increased. In addition, by using, for example, a lamp heater with high energy as a light source, deposition can be performed on a large area at a time, which results in reduction in production cost of the light-emitting device.

Embodiment Mode 4

Described in this embodiment mode is a method for manufacturing a light-emitting device that is capable of full color display by forming an EL layer of a light-emitting element with the use of a plurality of evaporation donor substrates of the present invention.

In Embodiment Mode 3, through one deposition process, an EL layer containing the same kind of material is formed over all of the plurality of electrodes over the second substrate that is a deposition target substrate. Described in this embodiment mode is the case where any of EL layers of three different emission colors are formed over the plurality of electrodes over the second substrate.

First, three evaporation donor substrates each of which is the evaporation donor substrate illustrated in FIG. 4A in Embodiment Mode 3 are prepared. Note that each evaporation donor substrate includes a material layer containing an evaporation material for forming EL layers of different emission colors. Specifically, a first evaporation donor substrate including a material layer (R) containing an evaporation material for forming an EL layer exhibiting red light emission (an EL layer (R)), a second evaporation donor substrate including a material layer (G) containing an evaporation material for forming an EL layer exhibiting green light emission (an EL layer (G)), and a third evaporation donor substrate including a material layer (B) containing an evaporation material for forming an EL layer exhibiting blue light emission (an EL layer (B)) are prepared.

In addition, one deposition target substrate including a plurality of first electrodes, which is illustrated in FIG. 4A in Embodiment Mode 3, is prepared. Note that because the edges of the plurality of first electrodes over the deposition target substrate are covered with an insulator, a light emitting region corresponds to a part of the first electrode, which is exposed without overlapping the insulator.

First, as a first deposition process, the deposition target substrate and the first evaporation donor substrate are superimposed on each other and aligned with each other. It is preferable that the deposition target substrate be provided with an alignment marker. It is preferable that the first evaporation donor substrate be also provided with an alignment marker. Note that since the first evaporation donor substrate includes a light absorption layer, a portion of the light absorption layer over and near the alignment marker is preferably removed in advance. In addition, since the first evaporation donor substrate includes the material layer (R), a portion of the material layer (R) over and near the alignment marker is also preferably removed in advance.

Then, a rear surface of the first evaporation donor substrate (the surface on which the reflective layer 102, the thermal insulation layer 104, the light absorption layer 105, and the material layer 106, which are illustrated in FIG. 4A, are not formed) is irradiated with light. The light absorption layer absorbs the irradiation light and provides heat to the material layer (R) to sublime the evaporation material contained in the material layer (R), whereby an EL layer (R) is formed over some of the first electrodes over the deposition target substrate. After the first deposition process is completed, the first evaporation donor substrate is moved away from the deposition target substrate.

Next, as a second deposition process, the deposition target substrate and the second evaporation donor substrate are superimposed on each other and aligned with each other. The second evaporation donor substrate is provided with a reflective layer having an opening at a position that is shifted by one pixel from the first evaporation donor substrate that is used in the first deposition process.

Then, a rear surface of the second evaporation donor substrate (the surface on which the reflective layer 102, the thermal insulation layer 104, the light absorption layer 105, and the material layer 106, which are illustrated in FIG. 4A, are not formed) is irradiated with light. The light absorption layer absorbs the irradiation light and provides heat to the material layer (G) to sublime the evaporation material contained in the material layer (G), whereby an EL layer (G) is formed over some of the first electrodes over the deposition target substrate, which are next to the first electrodes over which the EL layer (R) is formed in the first deposition process. After the second deposition process is completed, the second evaporation donor substrate is moved away from the deposition target substrate.

Next, as a third deposition process, the deposition target substrate and the third evaporation donor substrate are superimposed on each other and aligned with each other. The third evaporation donor substrate is provided with a reflective layer having an opening at a position that is shifted by two pixels from the first evaporation donor substrate that is used in the first deposition process.

Figure 5A:
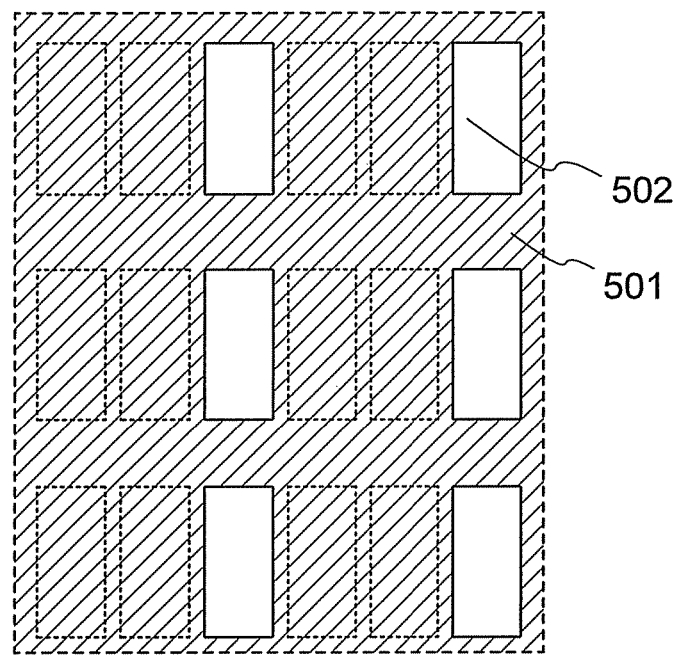
FIGS. 5A and 5B are diagrams illustrating an evaporation donor substrate of the present invention.

Then, a rear surface of the third evaporation donor substrate (the surface on which the reflective layer 102, the thermal insulation layer 104, the light absorption layer 105, and the material layer 106, which are illustrated in FIG. 4A, are not formed) is irradiated with light. The state just before the third deposition process corresponds to a top view of FIG. 5A. In FIG. 5A, a reflective layer 501 includes an opening 502. Accordingly, light transmitted through the opening 502 in the reflective layer 501 of the third evaporation donor substrate is transmitted through the thermal insulation layer and absorbed by the light absorption layer. Note that the first electrode is formed in a region of the deposition target substrate, which overlaps the opening 502 of the third evaporation donor substrate. Note that an EL layer (R) 511 formed in the first deposition process and an EL layer (G) 512 formed in the second deposition process are positioned under regions indicated by dotted lines in FIG. 5A.

Then, an EL layer (B) 513 is formed in the third deposition process. The light absorption layer absorbs the irradiation light and provides heat to the material layer (B) to sublime the evaporation material contained in the material layer (B), whereby the EL layer (B) 513 is formed over some of the first electrodes over the deposition target substrate, which are next to the first electrodes over which the EL layer (G) 512 is formed in the second deposition process. After the third deposition process is completed, the third evaporation donor substrate is moved away from the deposition target substrate.

In this manner, the EL layer (R) 511, the EL layer (G) 512, and the EL layer (B) 513 can be formed at regular intervals over one deposition target substrate. Then, a second electrode is formed over these layers, whereby light-emitting elements can be formed.

Through the above steps, light-emitting elements that exhibit different emission colors are formed over one substrate, whereby a light-emitting device capable of full color display can be formed.

Figure 5B:
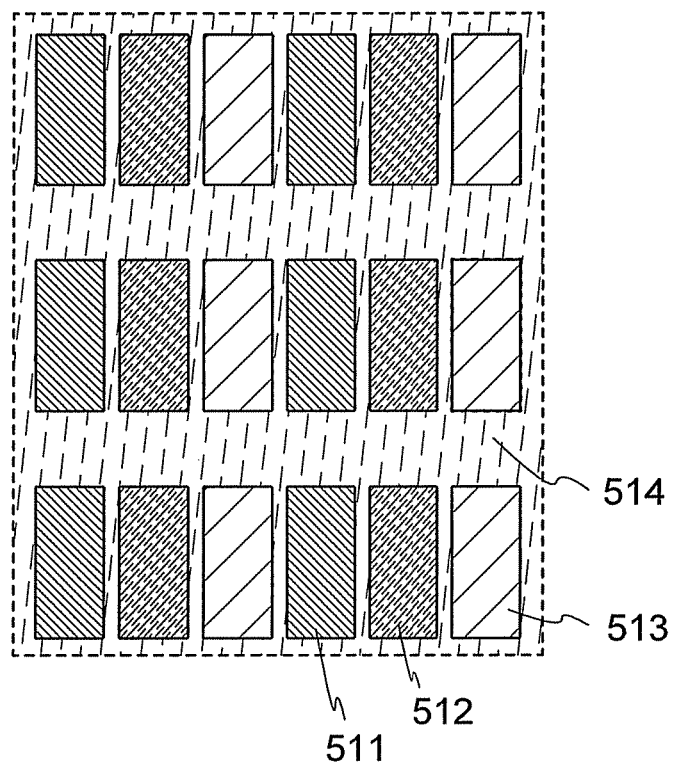

FIGS. 5A and 5B illustrate an example in which the opening 502 in the reflective layer formed over the evaporation donor substrate has a rectangular shape. However, the present invention is not particularly limited to this example and stripe openings may be employed. In the case of the stripe openings, although deposition is also performed between light emitting regions for emitting light of the same color, the deposition between light emitting regions is performed over an insulator 514, and thus a portion overlapping the insulator 514 does not serve as a light emitting region.

Figure 6A:
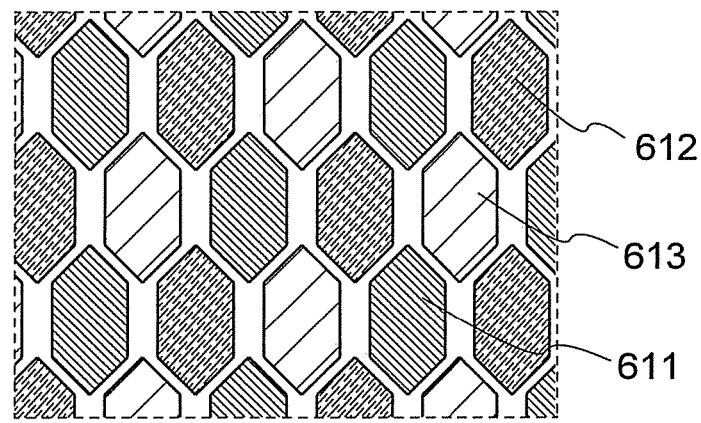
FIGS. 6A and 6B are diagrams illustrating an evaporation donor substrate of the present invention.
Figure 6B:
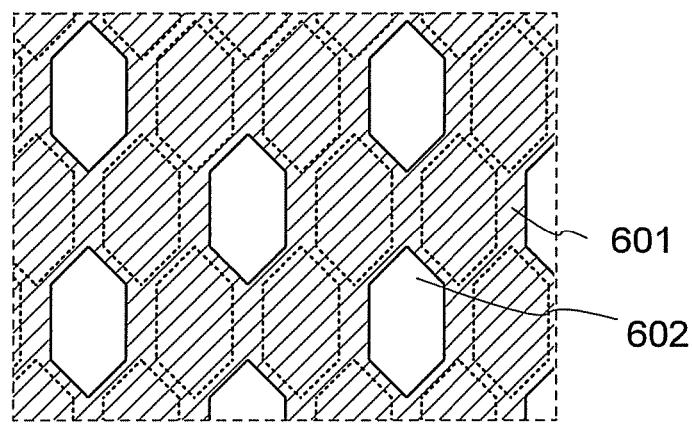

Similarly, there is no particular limitation on the arrangement of the pixels. The shape of each pixel may be a polygon, for example, a hexagon as illustrated in FIG. 6A, and a full color light-emitting device may be realized by arrangement of an EL layer (R) 611, an EL layer (G) 612, and an EL layer (B) 613. In order to form polygonal pixels illustrated in FIG. 6A, deposition may be performed using an evaporation donor substrate illustrated in FIG. 6B, which is provided with a reflective layer 601 having polygonal openings 602.

In manufacture of a light-emitting device capable of full color display described in Embodiment Mode 4, the thickness of a film deposited on a deposition target substrate can be controlled by controlling the thickness of the material layer formed over the evaporation donor substrate. Therefore, the practitioner does not need to adjust the evaporation rate by using a thickness monitor, and thus the deposition process can be fully automated.

In addition, in manufacture of a light-emitting device capable of full color display described in Embodiment Mode 4, an evaporation material contained in the material layer that is formed over the evaporation donor substrate during deposition can be uniformly sublimed by using the evaporation donor substrate of the present invention. Also in the case where the material layer contains a plurality of evaporation materials, a film containing the same evaporation materials in substantially the same weight ratio as the material layer can be deposited on a deposition target substrate. Accordingly, even in the case where a plurality of evaporation materials with different evaporation temperatures are used for deposition, by using the evaporation donor substrate of the present invention for the deposition, the evaporation rate of each evaporation material does not need to be controlled like co-evaporation. Therefore, without complicated control of the evaporation rate or the like, a desired layer containing different evaporation materials can be deposited easily and accurately.

Furthermore, in manufacture of a light-emitting device capable of full color display described in Embodiment Mode 4, a flat and even film can be deposited and a minute pattern can be formed by using the evaporation donor substrate of the present invention. Accordingly, a light-emitting device with high definition can be obtained, and further the characteristics of the light-emitting device can be improved. The use efficiency of an EL material can also be increased. In addition, by using, for example, a lamp heater with high energy as a light source, deposition can be performed on a large area at a time, which results in reduction in production cost of the light-emitting device.

Note that the structure shown in this embodiment mode can be combined with any of the structures shown in Embodiment Modes 1 to 3 as appropriate.

Embodiment Mode 5

Described in this embodiment mode is an example of a deposition apparatus that makes it possible to manufacture a light-emitting device in accordance with the present invention. FIGS. 7A and 7B and FIGS. 8A and 8B are schematic cross-sectional views of deposition apparatuses in accordance with the present invention.

Figure 7A:
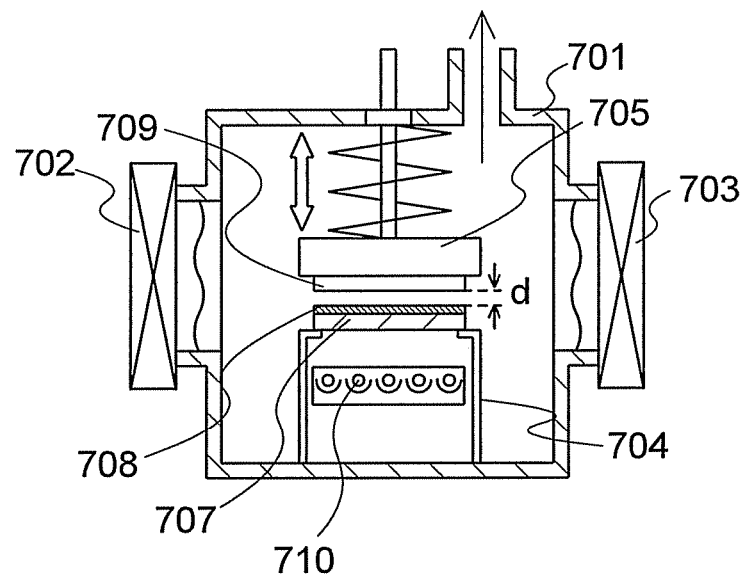
FIGS. 7A and 7B are diagrams illustrating a deposition apparatus.

In FIG. 7A, a deposition chamber 701 is a vacuum chamber and is connected to other treatment chambers via a first gate valve 702 and a second gate valve 703. The deposition chamber 701 includes at least an evaporation donor substrate supporting mechanism 704, a deposition target substrate supporting mechanism 705, and a light source 710.

First, in another deposition chamber, a material layer 708 is formed over an evaporation donor substrate 707. Here, as a supporting substrate that forms the evaporation donor substrate 707, a square plate substrate containing copper as its main material is used. For the material layer 708, a material that can be evaporated is used. Note that there is no particular limitation on the shape of the evaporation donor substrate 707 as long as the area thereof is the same as or larger than that of a deposition target substrate. The material layer 708 can be formed by a dry method or a wet method, and in particular, a wet method is preferably used. For example, the material layer 708 can be formed by spin coating, printing, or ink-jet.

The evaporation donor substrate 707 is transported to the deposition chamber 701 from the other deposition chamber and is set on the evaporation donor substrate supporting mechanism 704. A deposition target substrate 709 is fixed to the deposition target substrate supporting mechanism 705 so that a surface of the evaporation donor substrate 707, over which the material layer 708 is formed, faces a deposition target surface of the deposition target substrate 709.

The deposition target substrate supporting mechanism 705 is moved so that the distance between the evaporation donor substrate 707 and the deposition target substrate 709 becomes a distance d. Note that the distance d is defined as the distance between a surface of the material layer 708 formed over the evaporation donor substrate 707 and a surface of the deposition target substrate 709. In addition, in the case where some layer (e.g., a conductive layer functioning as an electrode or an insulator functioning as a partition wall) is formed over the deposition target substrate 709, the distance d is defined as the distance between the surface of the material layer 708 over the evaporation donor substrate 707 and the surface of a layer formed over the deposition target substrate 709. Note that in the case where the surface of the material layer 708 over the evaporation donor substrate 707, the surface of the deposition target substrate 709, or the surface of the layer formed on the deposition target substrate 709 has projections and depressions, the distance d is defined as the shortest distance between the surface of the material layer 708 over the evaporation donor substrate 707 and the outermost surface of the deposition target substrate 709 or the layer formed on the deposition target substrate 709. Specifically, the distance d is 0 mm to 2 mm, preferably, 0 mm to 0.05 mm, and more preferably, 0 mm to 0.003 mm.

Figure 7B:
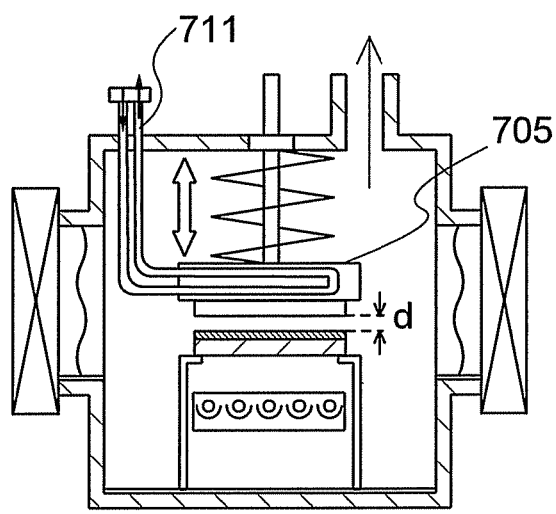

Here, the distance d is 0.001 mm. If the deposition target substrate 709 is hard like a quartz substrate and formed of a material that is hardly deformed (flexed, warped, or the like), the distance d can be reduced to 0 mm. Although FIGS. 7A and 7B illustrate examples in which the deposition target substrate supporting mechanism 705 is moved while the evaporation donor substrate supporting mechanism 704 is fixed for controlling the distance between the substrates, a structure may also be employed in which the evaporation donor substrate supporting mechanism 704 is moved while the deposition target substrate supporting mechanism 705 is fixed. Alternatively, both the evaporation donor substrate supporting mechanism 704 and the deposition target substrate supporting mechanism 705 may be moved. Note that FIG. 7A illustrates a cross section of a step in which the deposition target substrate supporting mechanism 705 is moved so that the evaporation donor substrate 707 and the deposition target substrate 709 are disposed close to each other to have the distance d therebetween.

Alternatively, a structure may also be employed in which the evaporation donor substrate supporting mechanism 704 and the deposition target substrate supporting mechanism 705 are moved not only in a vertical direction but also in a horizontal direction so that precise alignment is performed. In addition, the deposition chamber 701 may include an alignment mechanism such as CCD for precise alignment or measurement of the distance d. Furthermore, a sensor for measuring the temperature or humidity inside the deposition chamber 701, or the like may be provided.

The evaporation donor substrate 707 is irradiated with light from the light source 710. Thus, the material layer 708 over the evaporation donor substrate 707 is heated in a short time and an evaporation material contained in the material layer 708 is sublimed, whereby the evaporation material is deposited on a deposition target surface (i.e., a lower surface) of the deposition target substrate 709 that is placed to face the material layer 708. In the deposition apparatus illustrated in FIG. 7A, if the material layer 708 with a uniform thickness is formed over the evaporation donor substrate 707 in advance, a film with a uniform thickness can be deposited on the deposition target substrate 709 without any thickness monitor. Although a substrate is rotated in a conventional evaporation apparatus, the deposition target substrate is fixed during deposition in the deposition apparatus illustrated in FIG. 7A; thus, this deposition apparatus is suitable for deposition on a large-area glass substrate that is easily broken. In addition, in the deposition apparatus in FIG. 7A, the evaporation donor substrate is also fixed during deposition.

Note that it is preferable that a large part of the light source 710 be opposite the evaporation donor substrate 707 for uniform heating.

In order to reduce thermal effects on the material layer 708 over the evaporation donor substrate 707 caused by the light source on standby, an openable shutter for thermal insulation on standby (before an evaporation process) may be provided between the light source 710 and the evaporation donor substrate 707.

The light source 710 may be a heating means capable of uniform heating in a short time. For example, a lamp or a laser may be used.

When a lamp is used as the light source, discharge lamps such as a flash lamp (such as a xenon flash lamp or a krypton flash lamp), a xenon lamp, or a metal halide lamp, or exothermic lamps such as a halogen lamp or a tungsten lamp can be used. With a flash lamp, very high-intensity light can be repeatedly emitted in a short time (0.1 msec to 10 msec) to a large area; thus, heating can be performed uniformly and efficiently regardless of the area of the evaporation donor substrate. In addition, heating of the evaporation donor substrate 707 can also be controlled by changing the time interval of light emission. Furthermore, a flash lamp emits light for a short time; thus, thermal conduction to the counter substrate can be suppressed. In addition, because a flash lamp facilitates rapid heating, a vertical movement mechanism, a shutter, and the like can be simplified compared with the case of using a heater. Thus, further reduction in size of the deposition apparatus can be achieved.

When a laser is used as the light source, one or more of the following can be used: a gas laser such as an Ar laser, a Kr laser, or an excimer laser; a laser of which medium is single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ that is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When a solid state laser whose laser medium is solid is used, there are advantages in that maintenance-free condition can be maintained for a long time and output power is relatively stable.

Although FIG. 7A illustrates an example in which the light source 710 is placed in the deposition chamber 701, a part of an inner wall of the deposition chamber may be made of a light transmitting member and the light source 710 may be placed outside the deposition chamber. When the light source 710 is placed outside the deposition chamber 701, maintenance such as replacement of light bulbs of the light source 710 can be facilitated.

FIG. 7B illustrates an example of a deposition apparatus provided with a mechanism for controlling the temperature of the deposition target substrate 709. In FIG. 7B, the same components as those in FIG. 7A are denoted by the same reference numerals. In FIG. 7B, the deposition target substrate supporting mechanism 705 is provided with a tube 711 through which a heat medium flows. When a refrigerant flows as a heat medium through the tube 711, the deposition target substrate supporting mechanism 705 can be used as a cold plate. Note that the tube 711 has such a mechanism that can follow the vertical movement of the deposition target substrate supporting mechanism 705. As the heat medium, for example, water or silicone oil can be used. Note that an example of using the tube through which a refrigerant gas or a liquid refrigerant flows is described here; however, the deposition target substrate supporting mechanism 705 may be provided with a Peltier element or the like as a cooling means. Alternatively, not a cooling means but a heating means may be provided. For example, a heat medium for heating may be made to flow through the tube 711.

The deposition apparatus illustrated in FIG. 7B is useful in the case where different kinds of material layers are stacked. For example, in the case where a first material layer has been formed over the deposition target substrate 709, a second material layer having a higher evaporation temperature than the first material layer can be stacked on the first material layer. In FIG. 7A, since the deposition target substrate 709 and the evaporation donor substrate 707 are disposed close to each other, the first material layer that has been formed over the deposition target substrate 709 might be sublimed. By using the deposition apparatus illustrated in FIG. 7B, the second material layer can be stacked on the first material layer that has been formed over the deposition target substrate 709 while sublimation of the first material layer is suppressed using a cooling mechanism.

The deposition target substrate supporting mechanism 705 may be provided with a heating means such as a heater as well as the cooling mechanism. A mechanism for controlling (heating or cooling) the temperature of the deposition target substrate 709 can prevent flexure or the like of the substrate.

Figure 8A:
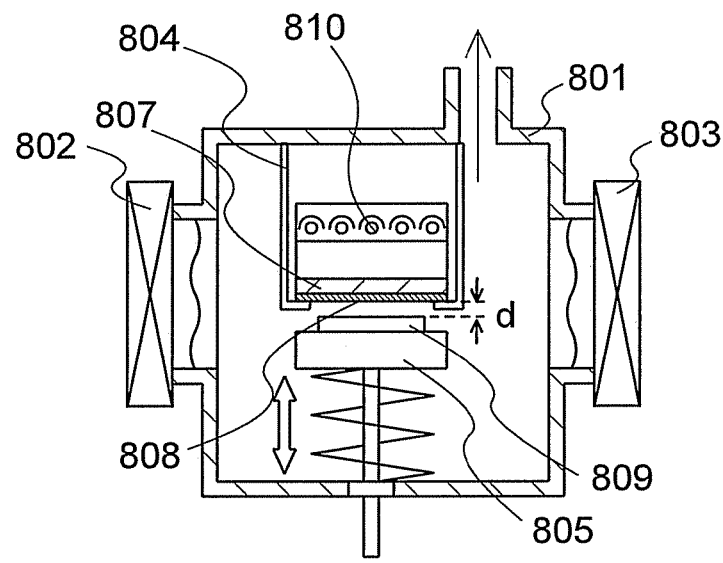
FIGS. 8A and 8B are diagrams illustrating a deposition apparatus.
Figure 8B:
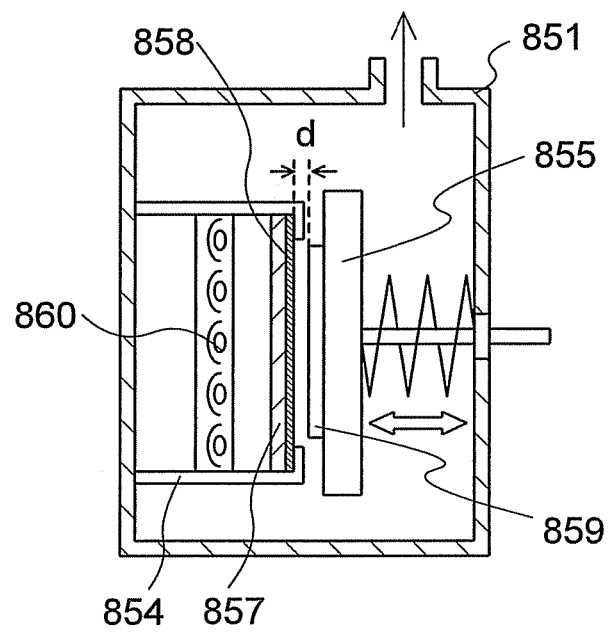

Although FIGS. 7A and 7B illustrate examples of the deposition apparatus employing a face-down system in which the deposition target surface of the deposition target substrate 709 faces downward, a deposition apparatus employing a face-up system as illustrated in FIGS. 8A and 8B may also be used.

In FIG. 8A, a deposition chamber 801 is a vacuum chamber and is connected to other treatment chambers via a first gate valve 802 and a second gate valve 803. The deposition chamber 801 includes at least an evaporation donor substrate supporting mechanism 804, a deposition target substrate supporting mechanism 805, and a light source 810.

A deposition process is as follows. First, in another deposition chamber, a material layer 808 is formed over an evaporation donor substrate 807. There is no particular limitation on the shape of the evaporation donor substrate 807 as long as the area thereof is the same as or larger than that of a deposition target substrate. The material layer 808 contains a plurality of materials that can be evaporated and have different evaporation temperatures. The material layer 808 can be formed by a dry method or a wet method, and in particular, a wet method is preferably used. For example, the material layer 808 can be formed by spin coating, printing, or ink-jet.

The evaporation donor substrate 807 is transported to the deposition chamber 801 from the other deposition chamber and is set on the evaporation donor substrate supporting mechanism 804. A deposition target substrate 809 is fixed to the deposition target substrate supporting mechanism 805 so that a surface of the evaporation donor substrate 807, over which the material layer 808 is formed, faces a deposition target surface of the deposition target substrate 809. As illustrated in FIG. 8A, this structure is an example of a face-up system in which the deposition target surface of the substrate faces upward. In the case of the face-up system, a large-area glass substrate that is easily warped is placed on a flat stage, or the glass substrate is supported by a plurality of pins, whereby the substrate has no flexure, and it is thus possible to realize a deposition apparatus in which a film of a uniform thickness can be obtained over an entire surface of the substrate.

The deposition target substrate supporting mechanism 805 is moved so that the distance between the evaporation donor substrate 807 and the deposition target substrate 809 becomes a distance d. Note that the distance d is defined as the distance between a surface of the material layer 808 formed over the evaporation donor substrate 807 and a surface of the deposition target substrate 809. In addition, in the case where some layer (e.g., a conductive layer functioning as an electrode or an insulator functioning as a partition wall) is formed over the deposition target substrate 809, the distance d is defined as the distance between the surface of the material layer 808 over the evaporation donor substrate 807 and the surface of a layer formed over the deposition target substrate 809. Note that in the case where the surface of the material layer 808 over the evaporation donor substrate 807, the surface of the deposition target substrate 809, or the surface of the layer formed on the deposition target substrate 809 has projections and depressions, the distance d is defined as the shortest distance between the surface of the material layer 808 over the evaporation donor substrate 807 and the outermost surface of the deposition target substrate 809 or the layer formed on the deposition target substrate 809. Specifically, the distance d is 0 mm to 2 mm, preferably, 0 mm to 0.05 mm, and more preferably, 0 mm to 0.003 mm.

Here, the distance d is 0.001 mm. Although FIG. 8A illustrates an example in which the deposition target substrate supporting mechanism 805 is moved while the evaporation donor substrate supporting mechanism 804 is fixed, a structure may also be employed in which the evaporation donor substrate supporting mechanism 804 is moved while the deposition target substrate supporting mechanism 805 is fixed. Alternatively, both the evaporation donor substrate supporting mechanism 804 and the deposition target substrate supporting mechanism 805 may be moved for controlling the distance d.

The evaporation donor substrate 807 is irradiated with light from the light source 810 while maintaining the distance d between the substrates as illustrated in FIG. 8A. Note that it is preferable that a large part of the light source 810 be opposite the evaporation donor substrate 807 for uniform heating.

By irradiation of the evaporation donor substrate 807 with light from the light source 810, the material layer 808 over the evaporation donor substrate 807 is heated in a short time and sublimed, and thus an evaporation material is deposited on a deposition target surface (i.e., an upper surface) of the deposition target substrate 809, which is placed to face the material layer 808. This makes it possible to drastically reduce the capacity of the chamber compared to a conventional evaporation apparatus having a large-capacity chamber; thus, a small-sized deposition apparatus can be realized.

The light source 810 is not specifically limited and may be a heating means capable of uniform heating in a short time. In the case where a surface to be irradiated is large, a lamp that can emit light at one time is preferable to a laser. In the example illustrated in FIG. 8A, the light source 810 is fixed above the deposition target substrate 809 and a film is deposited on an upper plane surface of the deposition target substrate 809 immediately after the light source 810 emits light.

Note that FIGS. 7A and 7B and FIG. 8A each illustrate an example of the deposition apparatus with a system in which a substrate is horizontally placed; however, a deposition apparatus with a system in which a substrate is vertically placed as illustrated in FIG. 8B can also be used.

In FIG. 8B, a deposition chamber 851 is a vacuum chamber. The deposition chamber 851 includes at least an evaporation donor substrate supporting mechanism 854, a deposition target substrate supporting mechanism 855, and a light source 860.

Although not illustrated, the deposition chamber 851 is connected to a first transport chamber to and from which a deposition target substrate is transported while being placed vertically. The deposition chamber 851 is also connected to a second transport chamber to and from which an evaporation donor substrate is transported while being placed vertically, although not illustrated. In this specification, 'a substrate is placed vertically' means that a substrate is placed so that a substrate surface makes a substantially right angle (ranging from 70° to 110°) with the horizontal surface. Since a large-area glass substrate or the like is easily warped, it is preferably transported while being placed vertically. Note that a lamp is used as the light source 860.

A deposition process is as follows. First, in another deposition chamber, a material layer 858 is formed over an evaporation donor substrate 857.

Next, the evaporation donor substrate 857 is transported to the deposition chamber 851 from the other deposition chamber and is set on the evaporation donor substrate supporting mechanism 854. A deposition target substrate 859 is fixed to the deposition target substrate supporting mechanism 855 so that a surface of the evaporation donor substrate 857, over which the material layer 858 is formed, faces a deposition target surface of the deposition target substrate 859.

The evaporation donor substrate 857 is irradiated with light from the light source 860 while maintaining the distance d between the substrates. Accordingly, the material layer 858 over the evaporation donor substrate 857 is heated in a short time and sublimed, and thus an evaporation material is deposited on a deposition target surface of the deposition target substrate 859, which is placed to face the material layer 858. This makes it possible to drastically reduce the capacity of the chamber compared to a conventional evaporation apparatus having a large-capacity chamber; thus, a small-sized deposition apparatus can be realized.

Note that by providing a plurality of deposition apparatuses shown in this embodiment mode, a multi-chamber manufacturing apparatus can be obtained. It is needless to say that the deposition apparatus shown in this embodiment mode can be combined with a deposition apparatus of another deposition method. Furthermore, a plurality of deposition apparatuses shown in this embodiment mode can be arranged in series, whereby an in-line manufacturing apparatus can be obtained.

By using such a deposition apparatus, a light-emitting device of the present invention can be manufactured. In the present invention, a material layer over an evaporation donor substrate, which is an evaporation source, can be easily prepared by a wet method. In addition, the thickness of a film deposited on a deposition target substrate can be controlled by controlling the thickness of the material layer formed over the evaporation donor substrate. Therefore, the practitioner does not need to adjust the evaporation rate by using a thickness monitor, and thus the deposition process can be fully automated. Furthermore, evaporation materials can be prevented from being attached to an inner wall of a deposition chamber, and thus maintenance of the deposition apparatus can be facilitated.

Furthermore, also in the case where a light-emitting device is manufactured using the deposition apparatus shown in this embodiment mode, a flat and even film can be deposited and a minute pattern of a light-emitting layer can be formed in the formation of an EL layer of a light-emitting element. Accordingly, a light-emitting device with high definition can be easily obtained. In addition, by using, for example, a lamp heater with high energy as a light source, deposition can be performed on a large area at a time; thus, a cycle time can be shortened resulting in reduction in production cost.

Note that the structure shown in this embodiment mode can be combined with any of the structures shown in Embodiment Modes 1 to 4 as appropriate.

Embodiment Mode 6

Described in this embodiment mode is an example of a deposition apparatus that performs evaporation by irradiating an evaporation donor substrate of the present invention with laser light.

Figure 9:
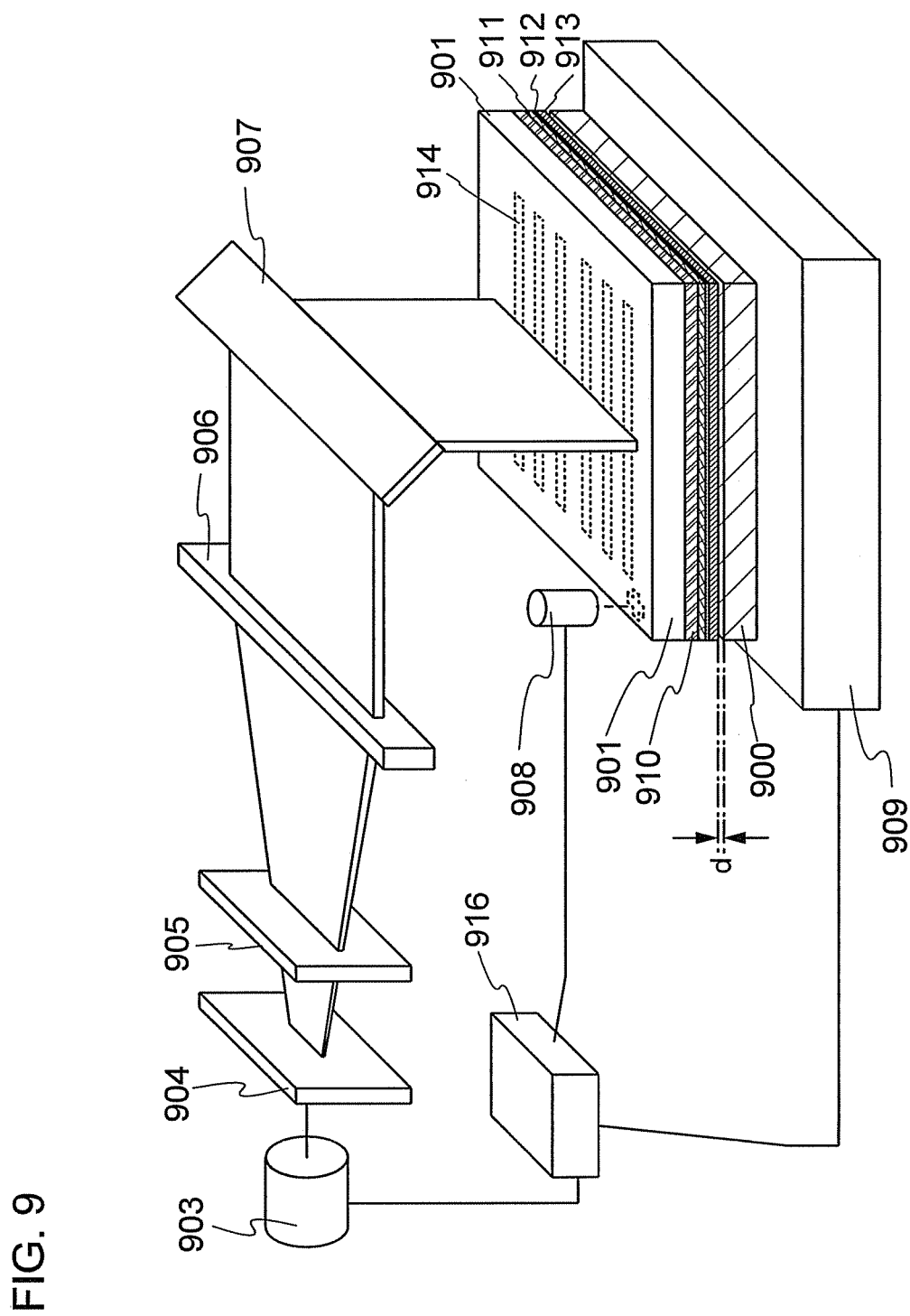
FIG. 9 is a diagram illustrating a deposition apparatus.

FIG. 9 is a perspective view illustrating an example of a deposition apparatus using a laser. Laser light is outputted from a laser device 903 (a YAG laser device, an excimer laser device, or the like) and transmitted through a first optical system 904 for changing the shape of a laser beam into a rectangular shape, a second optical system 905 for shaping the laser beam, and a third optical system 906 for collimating the beam. An optical path is bent to a direction perpendicular to an evaporation donor substrate 901 by use of a reflecting mirror 907. Then, the laser beam is emitted to the evaporation donor substrate.

Note that the structure of the evaporation donor substrate shown in Embodiment Mode 6 is similar to that shown in Embodiment Mode 1. In other words, a reflective layer 910, a thermal insulation layer 911, a light absorption layer 912, and a material layer 913 are formed over the substrate. In addition, the reflective layer 910 has an opening 914. In this embodiment mode, a material that can withstand laser irradiation is used for the reflective layer 910. Furthermore, a heat resistant metal is preferably used for the light absorption layer 912, for example, tungsten or tantalum can be used.

The shape of a laser spot with which the evaporation donor substrate 901 is irradiated is preferably a rectangular or linear shape. Specifically, the shape may be a rectangle with a shorter side of 1 mm to 5 mm and a longer side of 10 mm to 50 mm. Furthermore, in the case of using a large-area substrate, a laser spot preferably has a longer side of 20 cm to 100 cm in order to shorten processing time. In addition, a plurality of laser devices and optical systems illustrated in FIG. 9 may be provided to process a large-area substrate in a short time. Specifically, laser beams may be emitted from the plurality of laser devices so as to process divided areas of a substrate.

Note that FIG. 9 shows an example, and there is no particular limitation on the positional relationship between each optical system and electro-optical element placed in the path of laser light. For example, the reflective mirror is not always needed if the laser device 903 is placed above the evaporation donor substrate 901 so that laser light is emitted from the laser device 903 in a direction perpendicular to a principal plane of the evaporation donor substrate 901. Furthermore, each optical system may be a condenser lens, a beam expander, a homogenizer, a polarizer, or the like, and these may be combined. In addition, each optical system may be combined with a slit.

A region to be irradiated is two-dimensionally scanned with a laser beam as appropriate, whereby a large area of the substrate is irradiated. The scan is performed by relatively moving laser light irradiation region and the substrate. Here, the scan is performed with a moving means (not illustrated) for moving a substrate stage 909 holding the substrate in X and Y directions.

A control device 916 is preferably interlocked such that it can also control the moving means for moving the substrate stage 909 in the X and Y directions. Furthermore, the control device 916 is preferably interlocked such that it can also control the laser device 903. Moreover, the control device 916 is preferably interlocked with a positional alignment mechanism that has an image pickup element 908 for recognizing a position marker.

The positional alignment mechanism aligns the evaporation substrate 901 and a deposition target substrate 900 with each other.

The evaporation donor substrate 901 and the deposition target substrate 900 are disposed to face each other in proximity, so that the distance d therebetween is 0 mm to 2 mm, preferably 0 mm to 0.05 mm, and more preferably 0 mm to 0.003 mm. When the deposition target substrate 900 is provided with an insulator functioning as a partition wall, the insulator and the material layer 915 may be disposed in contact with each other.

When deposition is performed with the use of the deposition apparatus illustrated in FIG. 9, at least the evaporation donor substrate 901 and the deposition target substrate 900 are disposed in a vacuum chamber. All of the components illustrated in FIG. 9 may be placed in a vacuum chamber.

Although FIG. 9 illustrates an example of the deposition apparatus employing a so-called face-up system in which the deposition target surface of the deposition target substrate 900 faces upward, a deposition apparatus employing a face-down system may be used. When the deposition target substrate 900 is a large-area substrate, an apparatus employing a so-called vertical placement may also be employed in which a principal plane of the deposition target substrate 900 is perpendicular to a horizontal plane in order to suppress bending of the center of the substrate due to its own weight.

By further providing a cooling means for cooling the deposition target substrate 900, a flexible substrate such as a plastic substrate can be used as the deposition target substrate 900.

By providing a plurality of manufacturing apparatuses described in this embodiment mode, a multi-chamber manufacturing apparatus can be obtained. It is needless to say that a deposition apparatus of another deposition method can be combined therewith. Furthermore, a plurality of manufacturing apparatuses described in this embodiment mode can be arranged in series, whereby an in-line manufacturing apparatus can be obtained.

By using such a deposition apparatus, a light-emitting device of the present invention can be manufactured. In the present invention, a material layer over an evaporation donor substrate, which is an evaporation source, can be easily prepared by a wet method. In addition, the thickness of a film deposited on a deposition target substrate can be controlled by controlling the thickness of the material layer formed over the evaporation donor substrate. Therefore, the practitioner does not need to adjust the evaporation rate by using a thickness monitor, and thus the deposition process can be fully automated. Furthermore, evaporation materials can be prevented from being attached to an inner wall of a deposition chamber, and thus maintenance of the deposition apparatus can be facilitated.

Furthermore, also in the case where a light-emitting device is manufactured using the deposition apparatus shown in this embodiment mode, a flat and even film can be deposited and a minute pattern of a light-emitting layer can be formed in the formation of an EL layer of a light-emitting element. Accordingly, a light-emitting device with high definition can be easily obtained.

Note that the structure shown in this embodiment mode can be combined with any of the structures shown in Embodiment Modes 1 to 5 as appropriate.

Embodiment Mode 7

Described in this embodiment mode is a method for manufacturing a light-emitting element and a light-emitting device by application of the present invention.

Figure 10A:
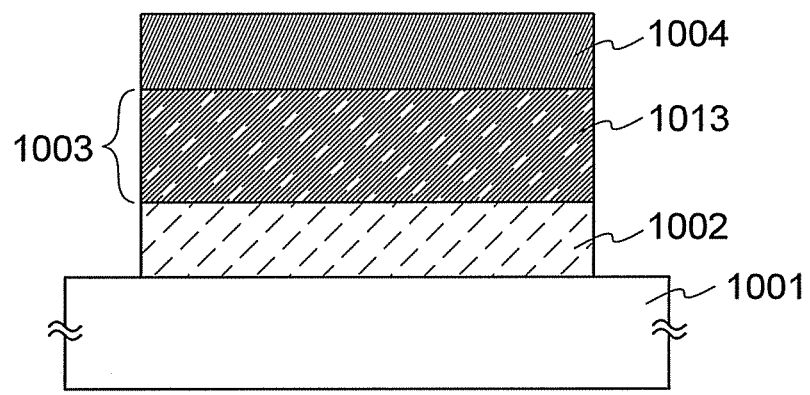
FIGS. 10A and 10B are diagrams illustrating a light-emitting element.
Figure 10B:
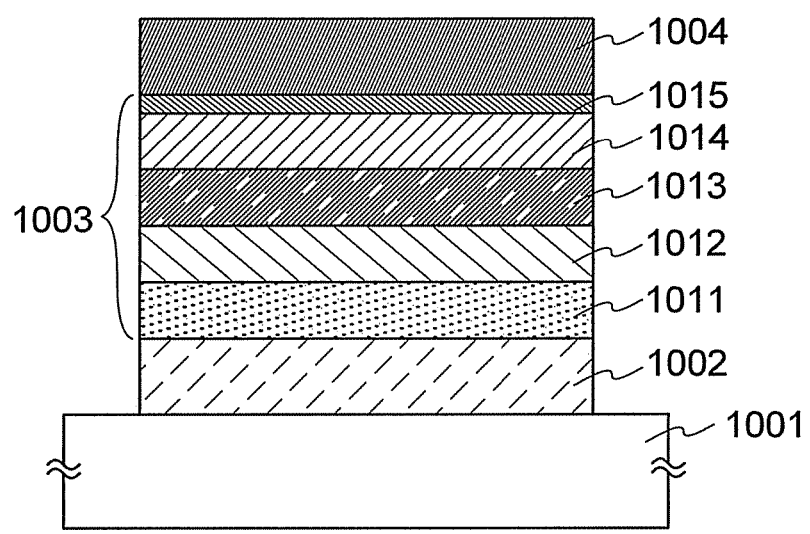

For example, light-emitting elements illustrated in FIGS. 10A and 10B can be manufactured. In the light-emitting element illustrated in FIG. 1A, a first electrode 1002, an EL layer 1003 including only a light-emitting layer 1013, and a second electrode 1004 are stacked in order over a substrate 1001. One of the first electrode 1002 and the second electrode 1004 functions as an anode, and the other functions as a cathode. Holes injected from the anode and electrons injected from the cathode are recombined in the EL layer 1003, whereby light emission can be obtained. In this embodiment mode, the first electrode 1002 functions as the anode and the second electrode 1004 functions as the cathode.

In the light-emitting element illustrated in FIG. 10B, the EL layer 1003 in FIG. 10A has a structure including a plurality of stacked layers. Specifically, a hole-injecting layer 1011, a hole-transporting layer 1012, the light-emitting layer 1013, an electron-transporting layer 1014, and an electron-injecting layer 1015 are provided in order from the first electrode 1002 side. Note that the EL layer 1003 functions when it includes at least the light-emitting layer 1013 as in FIG. 10A; therefore, not all the above layers are required and may be selected and provided as needed.

As the substrate 1001 in FIGS. 10A and 10B, a substrate having an insulating surface or an insulating substrate is employed. Specifically, a variety of glass substrates used for the electronics industry, such as an aluminosilicate glass substrate, an aluminoborosilicate glass substrate, or a barium borosilicate glass substrate can be used as well as a quartz substrate, a ceramic substrate, a sapphire substrate, or the like.

For the first electrode 1002 and the second electrode 1004, various types of metals, alloys, electrically conductive compounds, mixtures thereof, and the like can be used. Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide, or the like can be used. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), or the like can also be used.

Films of those materials are generally deposited by sputtering. For example, a film of indium oxide-zinc oxide can be formed by sputtering using a target in which zinc oxide is added to indium oxide at 1 wt % to 20 wt %. A film of indium oxide containing tungsten oxide and zinc oxide can be formed by sputtering using a target in which tungsten oxide and zinc oxide are added to indium oxide at 0.5 wt % to 5 wt % and 0.1 wt % to 1 wt %, respectively. Furthermore, films of those materials may be formed by ink-jet, spin coating, or the like by application of a sol-gel process or the like.

Alternatively, aluminum (Al), silver (Ag), an alloy containing aluminum, or the like can be used. It is also possible to use an element belonging to Group 1 or Group 2 of the periodic table, which has a low work function, that is, an alkali metal such as lithium (Li) or cesium (Cs), an alkaline earth metal such as magnesium (Mg), calcium (Ca), or strontium (Sr), or an alloy containing these elements (e.g., an alloy of aluminum, magnesium, and silver, or an alloy of aluminum and lithium); or a rare earth metal such as europium (Eu) or ytterbium (Yb), or an alloy thereof.

A film of an alkali metal, an alkaline earth metal, or an alloy containing such a metal can be formed by vacuum evaporation. An alloy film containing an alkali metal or an alkaline earth metal can also be formed by sputtering. Alternatively, silver paste or the like can be deposited by ink-jet or the like. The first electrode 1002 and the second electrode 1004 each are not limited to a single layer film, and may be a stacked-layer film.

Note that in order to extract light emitted from the EL layer 1003 to the outside, one or both of the first electrode 1002 and the second electrode 1004 are formed so as to transmit light. For example, one or both of the first electrode 1002 and the second electrode 1004 are formed using a conductive material having a light-transmitting property, such as indium tin oxide, or formed using silver, aluminum, or the like with a thickness of several nanometers to several tens of nanometers. Alternatively, one or both of the first electrode 1002 and the second electrode 1004 can have a stacked-layer structure including a thin film of a metal such as silver or aluminum and a thin film of a conductive material having a light-transmitting property, such as ITO.

The EL layer 1003 (the hole-injecting layer 1011, the hole-transporting layer 1012, the light-emitting layer 1013, the electron-transporting layer 1014, or the electron-injecting layer 1015) of the light-emitting element shown in this embodiment mode can be formed by application of the deposition method described in Embodiment Mode 1. In addition, the electrodes can also be formed by application of the deposition method described in Embodiment Mode 1.

For example, in the case where the light-emitting element illustrated in FIG. 10A is formed, a material layer of the evaporation donor substrate shown in Embodiment Mode 1 is formed of a material that forms the EL layer 1003 and the EL layer 1003 is formed over the first electrode 1002 over the substrate 1001 using the evaporation donor substrate. Then, the second electrode 1004 is formed over the EL layer 1003, whereby the light-emitting element illustrated in FIG. 10A can be obtained.

A variety of materials can be used for the light-emitting layer 1013. For example, a fluorescent compound that exhibits fluorescence or a phosphorescent compound that exhibits phosphorescence can be used.

Examples of a phosphorescent compound that can be used for the light-emitting layer 913 are given below. As a light-emitting material for blue emission, there are bis[2-(4',6'-difluorophenyl)pyridinato-N,$C^{2'}$]iridium(III)tetrakis(1-pyrazolyl)borate (FIr6), bis[2-(4',6'-difluorophenyl)pyridinato-N,$C^{2'}$]iridium(III)picolinate (FIrpic), bis[2-(3',5'-bistrifluoromethylphenyl)pyridinato-N,$C^{2'}$]iridium(III) picolinate (Ir($CF_3$ppy)$_2$(pic)), bis[2-(4',6'-difluorophenyl)pyridinato-N,$C^{2'}$]iridium(III)acetylacetonate (FIracac), and the like. As a light-emitting material for green emission, there are tris(2-phenylpyridinato-N,$C^{2'}$)iridium(III) (Ir(ppy)$_3$), bis(2-phenylpyridinato-N,$C^{2'}$)iridium(III)acetylacetonate (Ir(ppy)$_2$(acac)), bis(1,2-diphenyl-1H-benzimidazolato)iridium(III)acetylacetonate (Ir(pbi)$_2$(acac)), bis(benzo[h]quinolinato)iridium(III)acetylacetonate (Ir(bzq)$_2$(acac)), and the like. As a light-emitting material for yellow emission, there are bis(2,4-diphenyl-1,3-oxazolato-N,$C^{2'}$)iridium(III) acetylacetonate (Ir(dpo)$_2$(acac)), bis[2-(4'-(perfluorophenylphenyl)pyridinato]iridium(III)acetylacetonate (Ir(p-PF-ph)$_2$(acac)), bis(2-phenylbenzothiazolato-N,$C^{2'}$)iridium(III) acetylacetonate (Ir(bt)$_2$(acac)), and the like. As a light-emitting material for orange emission, there are tris(2- phenylquinolinato-N,C$^{2'}$)iridium(III) (Ir(pq)$_3$), bis(2-phenylquinolinato-N,C$^{2'}$)iridium(III)acetylacetonate (Ir(pq)$_2$(acac)), and the like. As a light-emitting material for red emission, there are organic metal complexes such as bis[2-(2'-benzo[4,5-α]thienyl)pyridinato-N,C$^{3'}$)iridium(III)acetylacetonate (Ir(btp)$_2$(acac)), bis(1-phenylisoquinolinato-N,C$^{2'}$)iridium(III)acetylacetonate (Ir(piq)$_2$(acac), (acetylacetonato)bis[2,3-bis(4-fluorophenyl)quinoxalinato] iridium(III) (Ir(Fdpq)$_2$(acac)), and 2,3,7,8,12,13,17,18-octaethyl-21H,23H-porphine platinum(II) (PtOEP). In addition, rare earth metal complexes such as tris(acetylacetonato) (monophenanthroline)terbium(III) (Tb(acac)$_3$(Phen)), tris(1,3-diphenyl-1,3-propanedionato)(monophenanthroline)europium(III) (Eu(DBM)$_3$(Phen)), and tris[1-(2-thenoyl)-3,3,3-trifluoroacetonato](monophenanthroline)europium(III) (Eu(TTA)$_3$(Phen)) emit light from a rare earth metal ion (electron transition between different multiplicities); therefore, such rare earth metal complexes can be used as phosphorescent compounds.

Examples of a fluorescent compound that can be used for the light-emitting layer 1013 are given below. As a light-emitting material for blue emission, there are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl) triphenylamine (YGAPA), and the like. As a light-emitting material for green emission, there are N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N',N'-triphenyl-1,4-phenylenediamine 2DPAPA), N-[9,10-bis(1,1'-biphenyl-2-yl)-2-anthryl]-N,N',N'-triphenyl-1,4-phenylenediamine (2DPABPhA), 9,10-bis (1,1'-biphenyl-2-yl)-N-[4-(9H-carbazol-9-yl)phenyl]-N-phenylanthracene-2-amine (2YGABPhA), N,N,9-triphenylanthracene-9-amine (DPhAPhA), and the like. As a light-emitting material for yellow emission, there are rubrene, 5,12-bis(1,1'-biphenyl-4-yl)-6,11-diphenyltetracene (BPT), and the like. As a light-emitting material for red emission, there are N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-diamine (p-mPhAFD), and the like.

The light-emitting layer 1013 may have a structure in which a substance having a high light-emitting property (a dopant material) is dispersed in another substance (a host material), whereby crystallization of the light-emitting layer can be suppressed. In addition, concentration quenching due to high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

As the host material used for the light-emitting layer 1013, for example, there are 4,4'-di(9-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like as well as 4,4'-bis[N-(1-naphthyl)-N-phenylamino]biphenyl (NPB), tris(8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As the dopant material, any of the aforementioned phosphorescent compounds or fluorescent compounds can be used.

When the light-emitting layer 1013 has a structure in which a substance having a high light-emitting property (a dopant material) is dispersed in another substance (a host material), a mixed layer of a host material and a guest material is formed as the material layer over the evaporation donor substrate. Alternatively, the material layer over the evaporation donor substrate may have a structure in which a layer containing a host material and a layer containing a dopant material are stacked. By forming the light-emitting layer 1013 using an evaporation donor substrate with the material layer having such a structure, the light-emitting layer 1013 contains a substance in which a light-emitting material is dispersed (a host material) and a substance having a high light-emitting property (a dopant material), and has a structure in which the substance having a high light-emitting property (a dopant material) is dispersed in the substance in which a light-emitting material is dispersed (a host material). Note that for the light-emitting layer 1013, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 10B is formed, the evaporation donor substrate described in Embodiment Mode 1, which has a material layer formed of a material for forming each layer in the EL layer 1003 (the hole-injecting layer 1011, the hole-transporting layer 1012, the electron-transporting layer 1014, and the electron-injecting layer 1015) is prepared, and deposition of each layer is performed using a different evaporation donor substrate by the method described in Embodiment Mode 1, whereby the EL layer 1003 is formed over the first electrode 1002 over the substrate 1001. Then, the second electrode 1004 is formed over the EL layer 1003, and thus the light-emitting element illustrated in FIG. 10B can be obtained. Although all the layers in the EL layer 1003 can be formed by the method described in Embodiment Mode 1 in this case, only some of the layers in the EL layer 1003 may be formed by the method described in Embodiment Mode 1.

For example, the hole-injecting layer 1011 can be formed of molybdenum oxide, vanadium oxide, ruthenium oxide, tungsten oxide, manganese oxide, or the like. Alternatively, the hole-injecting layer 1011 can be formed of a phthalocyanine-based compound such as phthalocyanine (H$_2$Pc) or copper phthalocyanine (CuPc), a high molecular compound such as poly(3,4-ethylenedioxythiophene)/poly(styrenesufonic acid) (PEDOT/PSS), or the like.

As the hole-injecting layer 1011, a layer that contains a substance having a high hole-transporting property and a substance having an electron-accepting property can be used. The layer that contains a substance having a high hole-transporting property and a substance having an electron-accepting property has a high carrier density and an excellent hole-injecting property. When the layer that contains a substance having a high hole-transporting property and a substance having an electron-accepting property is used as a hole-injecting layer that is in contact with an electrode functioning as an anode, a variety of metals, alloys, electrically conductive compounds, mixtures thereof, and the like can be used for the electrode regardless of the magnitude of work function of a material of the electrode functioning as an anode.

The layer that contains a substance having a high hole-transporting property and a substance having an electron-accepting property can be formed using, for example, an evaporation donor substrate having a material layer in which a layer containing a substance having a high hole-transporting property and a layer containing a substance having an electron-accepting property are stacked.

As the substance having an electron-accepting property, which is used for the hole-injecting layer 1011, there are 7,7,8,8-tetracyano-2,3,5,6-tetrafluoroquinodimethane (F4-TCNQ), chloranil, and the like. In addition, a transition metal oxide can also be used. Still other examples are oxides of a metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferably used because of their high electron accepting properties. Among them, molybdenum oxide is especially preferable because it is stable even in the atmospheric air, has a low hygroscopic property, and is easy to be handled.

As the substance having a high hole-transporting property used for the hole-injecting layer 1011, various compounds such as an aromatic amine compound, a carbazole derivative, an aromatic hydrocarbon, and a high molecular compound (such as oligomer, dendrimer, and polymer) can be used. Note that it is preferable that the substance having a high hole-transporting property used for the hole-injecting layer be a substance having a hole mobility of $10^{-6}$ cm$^2$/Vs or more. Note that any other substances may also be used as long as the hole-transporting properties thereof are higher than the electron-transporting properties thereof. Specific examples of the substance having a high hole-transporting property, which can be used for the hole-injecting layer 1011, are given below.

As the aromatic amine compound that can be used for the hole-injecting layer 1011, for example, there are 4,4'-bis[N-(1-naphthyl)-N-phenylamino]biphenyl (NPB), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), 4,4'-bis[N-(spiro-9,9'-bifluoren-2-yl)-N-phenylamino]biphenyl (BSPB), and the like. In addition, there are also N,N'-bis(4-methylphenyl)(p-tolyl)-N,N'-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), and the like.

As the carbazole derivative that can be used for the hole-injecting layer 1011, specifically, 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like can be used.

In addition, as the carbazole derivative that can be used for the hole-injecting layer 1011, there are also 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

As the aromatic hydrocarbon that can be used for the hole-injecting layer 1011, for example, there are 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butyl-anthracene, 9,10-bis[2-(1-naphthyl)phenyl] anthracene, 2,3,6,7-tetramethyl-9,10-di(1-naphthyl) anthracene, 2,3,6,7-tetramethyl-9,10-di(2-naphthyl) anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, and the like can also be used. As described above, an aromatic hydrocarbon having a hole mobility of $1\times10^{-6}$ cm$^2$/Vs or more and having 14 to 42 carbon atoms is more preferably used.

The aromatic hydrocarbon that can be used for the hole-injecting layer 1011 may have a vinyl skeleton. As the aromatic hydrocarbon having a vinyl skeleton, for example, there are 4,4'-bis(2,2-diphenylvinyl)biphenyl (DPVBi), 9,10-bis[4-(2,2-diphenylvinyl)phenyl]anthracene (DPVPA), and the like.

The hole-injecting layer 1011 can be formed by using an evaporation donor substrate having a material layer in which a layer containing a substance having a high hole-transporting property and a layer containing a substance having an electron-accepting property are stacked. When a metal oxide is used as the substance having an electron-accepting property, it is preferable that a layer containing the metal oxide be formed after the layer containing a substance having a high hole-transporting property is formed over the first substrate 1001. This is because, in many cases, a metal oxide has a higher decomposition temperature or an evaporation temperature than a substance having a high hole-transporting property. The evaporation source with such a structure makes it possible to efficiently sublime a substance having a high hole-transporting property and a metal oxide. In addition, local non-uniformity of the concentration in a film formed by evaporation can be suppressed. Furthermore, there are few kinds of solvents that allow both a substance having a high hole-transporting property and a metal oxide to be dissolved or dispersed therein, and a mixed solution is not easily formed; therefore, it is difficult to directly form a mixed layer by a wet method. However, the use of the deposition method of the present invention makes it possible to easily form a mixed layer that contains a substance having a high hole-transporting property and a metal oxide.

Since the layer that contains a substance having a high hole-transporting property and a substance having an electron-accepting property is excellent not only in hole-injecting properties but also in hole-transporting properties, and thus the aforementioned hole-injecting layer 1011 may be used as the hole-transporting layer.

The hole-transporting layer 1012 contains a substance having a high hole-transporting property. As the substance having a high hole-transporting property, for example, there are aromatic amine compounds such as 4,4'-bis[N-(1-naphthyl)-N-phenylamino]biphenyl (NPB or α-NPD), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), and 4,4'-bis[N-(spiro-9,9'-bifluoren-2-yl)-N-phenylamino]biphenyl (BSPB), and the like. The substances described here are mainly substances having a hole mobility of $10^{-6}$ cm$^2$/Vs or more. Note that any other substances may also be used as long as the hole-transporting properties thereof are higher than the electron-transporting properties thereof. Note that the layer that contains a substance having a high hole-transporting property is not limited to a single layer, but two or more layers that contain the aforementioned substances may be stacked.

The electron-transporting layer 1014 contains a substance having a high electron-transporting property. As the substance having a high electron-transporting property, for example, there are metal complexes having a quinoline skeleton or a benzoquinoline skeleton, such as tris(8-quinolinolato)aluminum, (Alq), tris(4-methyl-8-quinolinolato)aluminum (Almq$_3$), bis(10-hydroxybenzo[h]quinolinato) beryllium (BeBq$_2$), and bis(2-methyl-8-quinolinolato)(4-phenylphenolato)aluminum (BAlq). Alternatively, metal complexes having an oxazole-based ligand or a thiazole-based ligand, such as bis[2-(2-hydroxyphenyl)benzoxazolato]zinc (Zn(BOX)$_2$) and bis[2-(2-hydroxyphenyl)benzothiazolato]zinc (Zn(BTZ)$_2$) can be used. Further alternatively, besides the metal complexes, 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ01), bathophenanthroline (BPhen), bathocuproine (BCP), or the like can also be used. The substances described here are mainly substances having a hole mobility of $10^{-6}$ cm$^2$/Vs or more. Note that any other substances may also be used as long as the electron-transporting properties thereof are higher than the hole-transporting properties thereof. In addition, the electron-transporting layer is not limited to a single layer, but two or more layers that contain the aforementioned substances may be stacked.

As the electron-injecting layer 1015, a compound of an alkali metal or an alkaline earth metal, such as lithium fluoride (LiF), cesium fluoride (CsF), or calcium fluoride (CaF$_2$) can be used. Alternatively, a layer in which a substance having an electron-transporting property is combined with an alkali metal or an alkaline earth metal can be used. For example, a layer made of Alq containing magnesium (Mg) can be used. Note that it is preferable that the layer in which a substance having an electron-transporting property is combined with an alkali metal or an alkaline earth metal be used as the electron-injecting layer because electrons are efficiently injected from the second electrode 1004.

Note that there is no particular limitation on a stacked-layer structure of the EL layer 1003. The EL layer 1003 may be formed by an appropriate combination of a light-emitting layer with a layer formed of a substance having a high electron-transporting property, a substance having a high hole-transporting property, a substance having a high electron-injecting property, a substance having a high hole-injecting property, a bipolar substance (a substance having high electron and hole-transporting properties), or the like.

Light emission from the EL layer 1003 is extracted to the outside through one or both of the first electrode 1002 and the second electrode 1004. Therefore, one or both of the first electrode 1002 and the second electrode 1004 are an electrode having a light-transmitting property. In the case where only the first electrode 1002 is an electrode having a light-transmitting property, light is extracted from the substrate 1001 side through the first electrode 1002. In the case where only the second electrode 1004 is an electrode having a light-transmitting property, light is extracted from the side opposite to the substrate 1001 through the second electrode 1004. In the case where both the first electrode 1002 and the second electrode 1004 are electrodes having a light-transmitting property, light is extracted from both the substrate 1001 side and the side opposite to the substrate 1001 through the first electrode 1002 and the second electrode 1004, respectively.

Note that, although FIGS. 10A and 10B illustrate the structure in which the first electrode 1002 functioning as an anode is provided on the substrate 1001 side, the second electrode 1004 functioning as a cathode may be provided on the substrate 1001 side.

The EL layer 1003 is formed by the deposition method described in Embodiment Mode 3 or may be formed by a combination of the deposition method described in Embodiment Mode 3 with another deposition method. A different deposition method may be used to form each electrode or each layer. As a dry method, there are vacuum evaporation, electron beam evaporation, sputtering, and the like. As a wet method, there are ink-jet, spin coating, and the like.

In the light-emitting element of this embodiment mode, an EL layer can be formed by application of an evaporation donor substrate of the present invention. Accordingly, a highly accurate film can be formed efficiently. Therefore, not only improvement in characteristics of the light-emitting element, but also improvement in yield and reduction in cost can be achieved.

Embodiment Mode 8

Described in this embodiment mode is a light-emitting device that is formed using the light-emitting element described in Embodiment Mode 7.

First, a passive matrix light-emitting device will be described with reference to FIGS. 11A to 11C and FIG. 12.

In a passive matrix (also referred to as 'simple matrix') light-emitting device, a plurality of anodes arranged in stripes (in strip form) are provided to be perpendicular to a plurality of cathodes arranged in stripes, and a light-emitting layer is located at each intersection. Therefore, a pixel at the intersection of an anode that is selected (to which voltage is applied) and a cathode that is selected emits light.

Figure 11A:
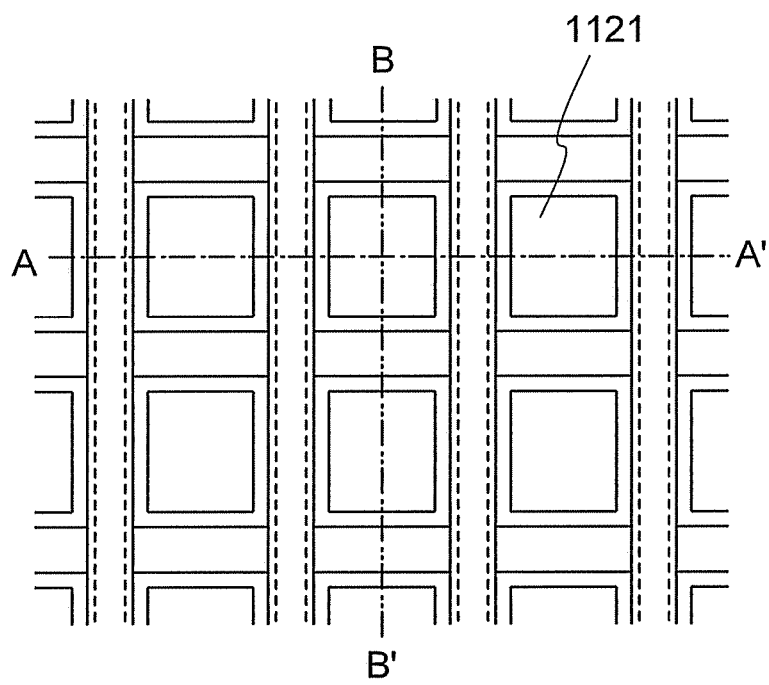
FIGS. 11A to 11C are diagrams illustrating a passive matrix light-emitting device.
Figure 11C:
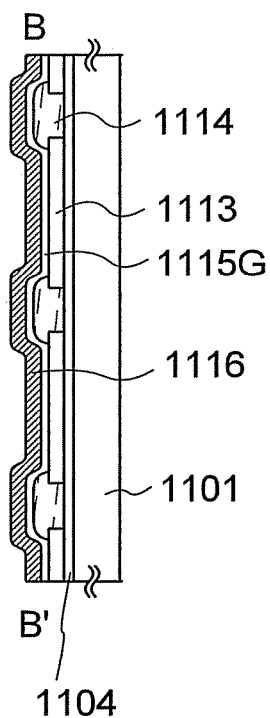
Figure 11B:
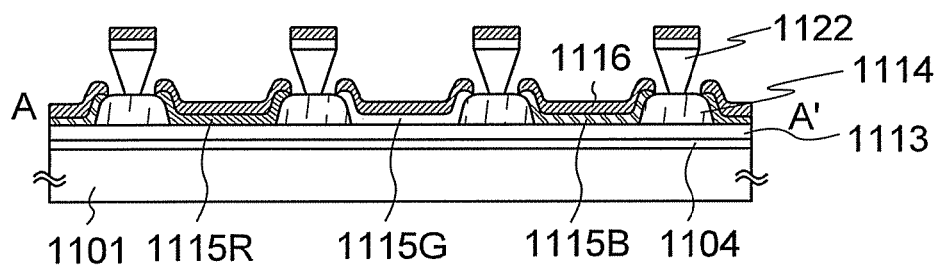

FIG. 11A is a top view of a pixel portion before sealing. FIG. 11B is a cross-sectional view taken along a dashed line A-A' in FIG. 11A. FIG. 11C is a cross-sectional view taken along a dashed line B-B'.

Over a substrate 1101, an insulating layer 1104 is formed as a base insulating layer. Note that the base insulating layer is not necessarily formed if not needed. Over the insulating layer 1104, a plurality of first electrodes 1113 are arranged in stripes at regular intervals. A partition wall 1114 having openings each corresponding to a pixel is provided over the first electrodes 1113. The partition wall 1114 having openings is formed of an insulating material (a photosensitive or non-photosensitive organic material (e.g., polyimide, acrylic, polyamide, polyimide amide, resist, or benzocyclobutene) or an SOG film (e.g., a SiO$_x$ film containing an alkyl group)). Note that the openings each corresponding to a pixel serve as light emitting regions 1121.

Over the partition wall 1114 having openings, a plurality of inversely tapered partition walls 1122 that are parallel to each other are provided to intersect with the first electrodes 1113. The inversely tapered partition walls 1122 are formed by a photolithography step using a positive photosensitive resin, of which portion unexposed to light remains as a pattern, by adjusting the amount of light exposure or the length of development time so that a lower portion of a pattern is etched more.

The total thickness of the partition wall 1114 having openings and the inversely tapered partition wall 1122 is set to be larger than the total thickness of an EL layer and a second electrode 1116. Thus, an EL layer that is divided into plural regions, specifically, an EL layer (R) (1115R) formed of a material exhibiting red light emission, an EL layer (G) (1115G) formed of a material exhibiting green light emission, and an EL layer (B) (1115B) formed of a material exhibiting blue light emission; and the second electrodes 1116 are formed. Note that the plurality of separated regions are electrically isolated from each other.

The second electrodes 1116 are electrodes in stripes that are parallel to each other and extend in a direction intersecting with the first electrodes 1113. Note that the EL layers and a part of conductive layers forming the second electrodes 1116 are also formed over the inversely tapered partition walls 1122; however, they are separated from the EL layer (R) (1115R), the EL layer (G) (1115G), the EL layer (B) (1115B), and the second electrodes 1116. Note that the EL layer in this embodiment mode is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (1115R), the EL layer (G) (1115G), and the EL layer (B) (1115B) are selectively formed to form a light-emitting device that emits three kinds of lights (red (R), green (G), blue (B)) and is capable of full color display. The EL layer (R) (1115R), the EL layer (G) (1115G), and the EL layer (B) (1115B) are formed into stripes parallel to each other. These EL layers may be formed by the deposition method described in Embodiment Modes 1 and 2.

Furthermore, sealing is performed using a sealant such as a sealant can or a glass substrate for sealing, if necessary. Here, a glass substrate is used as a sealing substrate, and the substrate and the sealing substrate are attached to each other with an adhesive material such as a sealant to seal a space surrounded by the adhesive material such as a sealant. The space that is sealed is filled with a filler or a dry inert gas. In addition, a desiccant or the like may be put between the substrate and the sealant in order to increase the reliability of the light-emitting device. A small amount of moisture is removed by the desiccant, whereby sufficient drying is performed. The desiccant may be a substance that absorbs moisture by chemical adsorption, such as oxide of an alkaline earth metal as typified by calcium oxide or barium oxide. Note that a substance that adsorbs moisture by physical adsorption, such as zeolite or silica gel may alternatively be used.

Note that, if the sealant is provided covering and in contact with the light-emitting element to sufficiently block the outside air, the desiccant is not necessarily provided.

Figure 12:
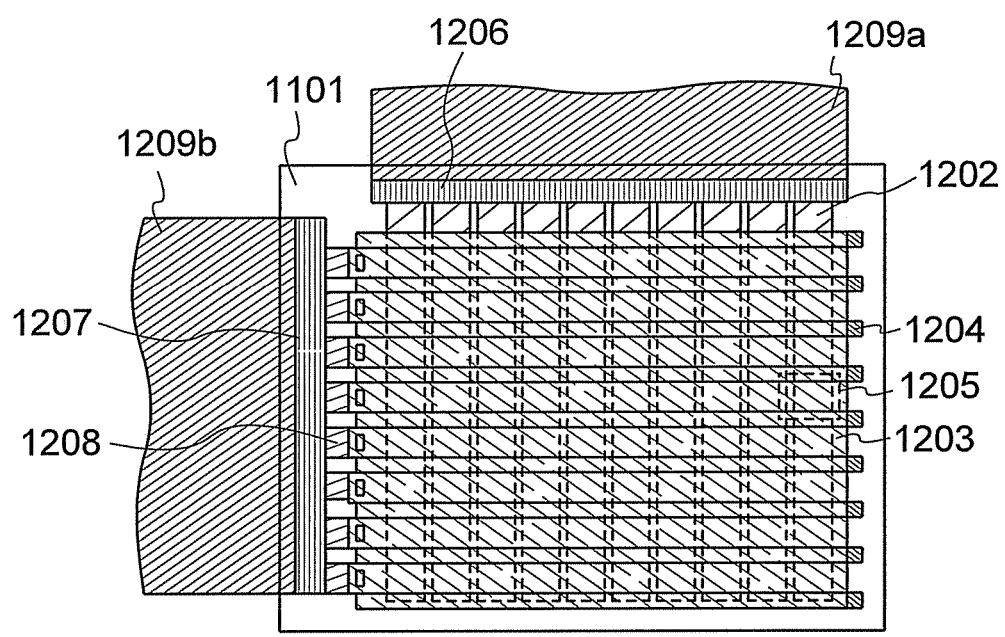
FIG. 12 is a diagram illustrating a passive matrix light-emitting device.

FIG. 12 is a top view of the case in which the passive matrix light-emitting device illustrated in FIGS. 11A to 11C is connected to an FPC or the like.

In FIG. 12, scan lines and data lines perpendicularly intersect with each other in a pixel portion for displaying images.

Here, the first electrodes 1113 in FIGS. 11A to 11C correspond to scan lines 1203 in FIG. 12; the second electrodes 1116 correspond to data lines 1202; and the inversely tapered partition walls 1122 correspond to partition walls 1204. EL layers are sandwiched between the data lines 1202 and the scan lines 1203, and an intersection indicated by a region 1205 corresponds to one pixel.

Note that ends of the scan lines 1203 are electrically connected to a connection wiring 1208, and the connection wiring 1208 is connected to an FPC 1209*b* through an input terminal 1207. The data lines 1202 are connected to an FPC 1209*a* through an input terminal 1206.

If necessary, a polarizing plate, a circularly polarizing plate (including an elliptically polarizing plate), a retardation plate (a quarter-wave plate or a half-wave plate), or an optical film such as a color filter may be provided as appropriate over a light emitting surface. Furthermore, the polarizing plate or the circularly polarizing plate may be provided with an anti-reflection film. For example, anti-glare treatment may be carried out by which reflected light can be diffused by surface roughness so as to reduce glare.

Although FIG. 12 illustrates an example in which a driver circuit is not provided over the substrate, the present invention is not particularly limited to this example. An IC chip including a driver circuit may be mounted on the substrate.

In the case where an IC chip is mounted, a data line side IC and a scan line side IC, each of which includes a driver circuit for transmitting each signal to the pixel portion, are mounted on the periphery of (outside of) the pixel portion by COG. The mounting may be performed by TCP or wire bonding other than COG. A TCP is a TAB tape mounted with an IC, and the IC is mounted by connecting the TAB tape to a wiring over an element forming substrate. Each of the data line side IC and the scan line side IC may be formed using a silicon substrate. Alternatively, a driver circuit may be formed using TFTs over a glass substrate, a quartz substrate, or a plastic substrate. Although described here is an example in which a single IC is provided on one side, a plurality of ICs may be provided on one side.

Next, an example of an active matrix light-emitting device is described with reference to FIGS. 13A and 13B. Note that FIG. 13A is a top view of a light-emitting device and FIG. 13B is a cross-sectional view taken along a dashed line A-A' in FIG. 13A. The active matrix light-emitting device of this embodiment mode includes a pixel portion 1302 provided over an element substrate 1310, a driver circuit portion (a source side driver circuit) 1301, and a driver circuit portion (a gate side driver circuit) 1303. The pixel portion 1302, the driver circuit portion 1301, and the driver circuit portion 1303 are sealed with a sealant 1305 between the element substrate 1310 and a sealing substrate 1304.

Over the element substrate 1310, a lead wiring 1308 is provided to connect an external input terminal that transmits a signal (e.g., a video signal, a clock signal, a start signal, or a reset signal) or a potential to the driver circuit portion 1301 and the driver circuit portion 1303. Here, an example is shown in which a flexible printed circuit (FPC) 1309 is provided as the external input terminal. Although only the FPC is illustrated here, the FPC may be provided with a printed wiring board (PWB). The light-emitting device in this specification includes not only the light-emitting device itself, but also the light-emitting device with an FPC or a PWB.

Then, a cross-sectional structure is described with reference to FIG. 13B. While the driver circuit portion and the pixel portion are provided over the element substrate 1310, FIG. 13B only illustrates the driver circuit portion 1301, which is the source side driver circuit, and the pixel portion 1302.

An example is shown in which a CMOS circuit that is a combination of an n-channel TFT 1323 and a p-channel TFT 1324 is formed in the driver circuit portion 1301. Note that a circuit included in the driver circuit portion may be formed using various CMOS circuits, PMOS circuits, or NMOS circuits. In this embodiment mode, a driver-integrated type in which a driver circuit is formed over a substrate is described; however, a driver circuit is not necessarily formed over the substrate, and may be formed outside the substrate.

The pixel portion 1302 includes a plurality of pixels, each of which includes a switching TFT 1311, a current controlling TFT 1312, and a first electrode 1313 that is electrically connected to a wiring (a source electrode or a drain electrode) of the current controlling TFT 1312. Note that an insulator 1314 is formed covering an end portion of the first electrode 1313. In this embodiment mode, the insulator 1314 is formed using a positive photosensitive acrylic resin.

The insulator 1314 is preferably formed to have a curved surface with curvature at an upper end portion or a lower end portion in order to obtain favorable coverage by a film that is to be stacked over the insulator 1314. For example, in the case of using a positive photosensitive acrylic resin as a material for the insulator 1314, the insulator 1314 is preferably formed to have a curved surface with a curvature radius (0.2 µm to 3 µm) at the upper end portion thereof. Note that either a negative photosensitive material that becomes insoluble in an etchant by light irradiation or a positive photosensitive material that becomes soluble in an etchant by light irradiation can be used for the insulator 1314. As the insulator 1314, without limitation to an organic compound, either an organic compound or an inorganic compound such as silicon oxide or silicon oxynitride can be used.

An EL layer 1300 and a second electrode 1316 are stacked over the first electrode 1313. Note that when an ITO film is used as the first electrode 1313, and a stacked-layer film of a titanium nitride film and a film containing aluminum as its main component or a stacked-layer film of a titanium nitride film, a film containing aluminum as its main component, and a titanium nitride film is used as the wiring of the current controlling TFT 1312 that is connected to the first electrode 1313, the resistance of the wiring is low and favorable ohmic contact with the ITO film can be obtained. Although not illustrated, the second electrode 1316 is electrically connected to the FPC 1309, which is an external input terminal.

In the EL layer 1300, at least the light-emitting layer is provided, and in addition to the light-emitting layer, a hole-injecting layer, a hole-transporting layer, an electron-transporting layer, or an electron-injecting layer is provided as appropriate. A light-emitting element 1315 is formed by a stack of the first electrode 1313, the EL layer 1300, and the second electrode 1316.

Although the cross-sectional view of FIG. 13B illustrates only one light-emitting element 1315, a plurality of light-emitting elements are arranged in matrix in the pixel portion 1302. Light-emitting elements that emit three kinds of lights (R, G, and B) are formed in the pixel portion 1302, whereby a light-emitting device capable of full color display can be obtained. Alternatively, a light-emitting device capable of full color display may be formed by a combination with color filters.

Furthermore, the sealing substrate 1304 and the element substrate 1310 are attached to each other with the sealant 1305, whereby the light-emitting element 1315 is provided in a space 1307 surrounded by the element substrate 1310, the sealing substrate 1304, and the sealant 1305. Note that the space 1307 may be filled with the sealant 1305, as well as with an inert gas (such as nitrogen or argon).

Note that an epoxy-based resin is preferably used as the sealant 1305. It is preferable that such a material transmit as little moisture and oxygen as possible. As the sealing substrate 1304, a plastic substrate formed of fiberglass-reinforced plastics (FRP), polyvinyl fluoride (PVF), polyester, acrylic, or the like can be used besides a glass substrate or a quartz substrate.

In such a manner, a light-emitting device can be obtained by application of the present invention. The production cost of an active matrix light-emitting device per device tends to be high because TFTs are manufactured; however, by using the present invention, loss of materials in forming light-emitting elements can be drastically reduced. Thus, reduction in production cost can be achieved.

By using the present invention, an EL layer forming a light-emitting element can be easily formed and further a light-emitting device including the light-emitting element can be easily manufactured. In addition, a flat and even film can be deposited and a minute pattern can be formed; thus, a light-emitting device with high definition can be obtained. Furthermore, a lamp heater or the like with high energy can be used as a light source in deposition; accordingly, a cycle time can be shortened resulting in reduction in production cost.

Note that the structure shown in this embodiment mode can be combined with any of the structures shown in Embodiment Modes 1 to 7 as appropriate.

Embodiment Mode 9

In this embodiment mode, various electronic appliances each of which is completed using a light-emitting device manufactured by application of the present invention will be described with reference to FIGS. 14A to 14E.

As examples of electronic appliances to which a light-emitting device of the present invention is applied, there are televisions, cameras such as video cameras and digital cameras, goggle type displays (head-mounted displays), navigation systems, audio reproduction devices (e.g., car audio systems and audio systems), laptop computers, game machines, portable information terminals (e.g., mobile computers, cellular phones, portable game machines, and e-book readers), image reproduction devices provided with a recording medium (specifically, devices that are capable of reproducing recording media such as digital versatile discs (DVDs) and equipped with a display device for displaying the reproduced images), lighting equipment, and the like. Specific examples of such electronic appliances are illustrated in FIGS. 14A to 14E.

Figure 14A:
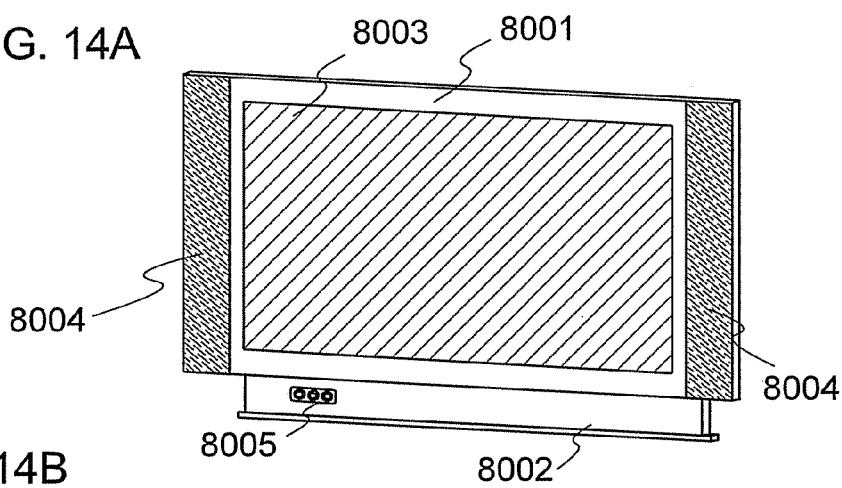
FIGS. 14A to 14E are views each illustrating an electronic appliance.

FIG. 14A illustrates a display device that includes a housing 8001, a supporting base 8002, a display portion 8003, speaker portions 8004, a video input terminal 8005, and the like. A light-emitting device that is formed by application of the present invention is used for the display portion 8003. Note that the display device includes all devices for displaying information in its category, for example, devices for personal computers, for receiving TV broadcasting, and for displaying an advertisement. Application of the present invention makes it possible to achieve increase in use efficiency of materials and increase in manufacturing efficiency mainly in a deposition process of a light-emitting device. Accordingly, production cost can be reduced and productivity can be improved in manufacturing a display device; thus, an inexpensive display device can be provided.

Figure 14B:
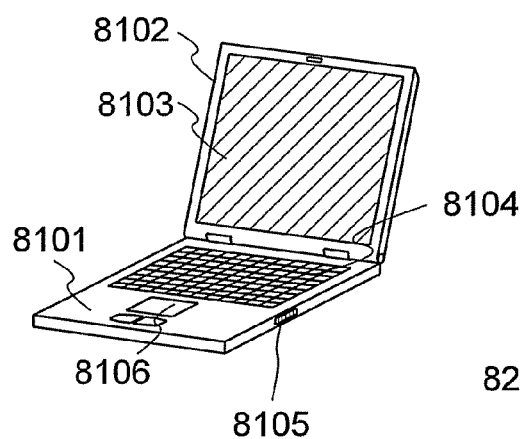

FIG. 14B illustrates a computer that includes a main body 8101, a housing 8102, a display portion 8103, a keyboard 8104, an external connecting port 8105, a pointing device 8106, and the like. A light-emitting device that is formed by application of the present invention is used for the display portion 8103 of the computer. Application of the present invention makes it possible to achieve increase in use efficiency of materials and increase in manufacturing efficiency mainly in a deposition process of a light-emitting device. Accordingly, production cost can be reduced and productivity can be improved in manufacturing a computer; thus, an inexpensive computer can be provided.

Figure 14C:
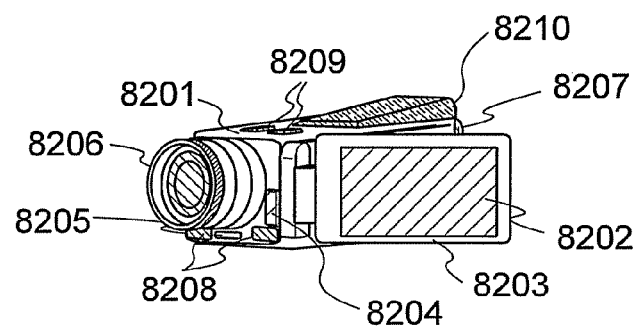

FIG. 14C illustrates a video camera that includes a main body 8201, a display portion 8202, a housing 8203, an external connecting port 8204, a remote control receiving portion 8205, an image receiving portion 8206, a battery 8207, audio input portions 8208, operation keys 8209, an eyepiece portion 8210, and the like. A light-emitting device that is formed by application of the present invention is used for the display portion 8202 of the video camera. Application of the present invention makes it possible to achieve increase in use efficiency of materials and increase in manufacturing efficiency mainly in a deposition process of a light-emitting device. Accordingly, production cost can be reduced and productivity can be improved in manufacturing a video camera; thus, an inexpensive video camera can be provided.

Figure 14D:
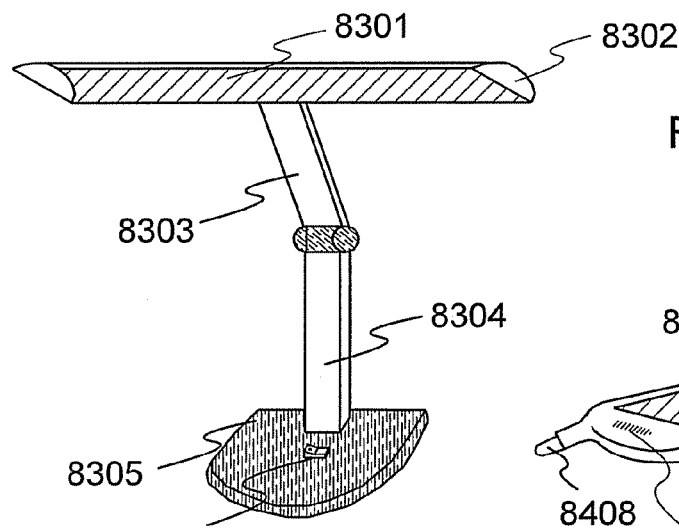

FIG. 14D illustrates a desk lamp that includes a lighting portion 8301, a shade 8302, an adjustable arm 8303, a support 8304, a base 8305, and a power supply 8306. A light-emitting device that is formed by application of the present invention is used for the lighting portion 8301 of the desk lamp. Note that the lamp includes a ceiling light, a wall light, and the like in its category. Application of the present invention makes it possible to achieve increase in use efficiency of materials and increase in manufacturing efficiency mainly in a deposition process of a light-emitting device. Accordingly, production cost can be reduced and productivity can be improved in manufacturing a desk lamp; thus, an inexpensive desk lamp can be provided.

Figure 14E:
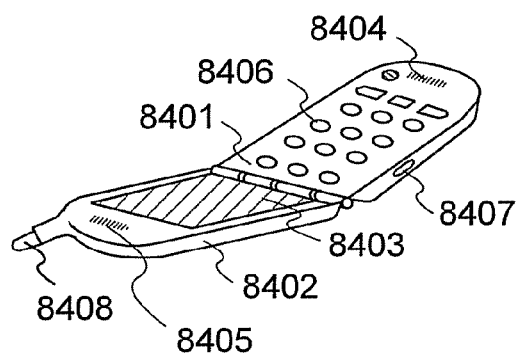

FIG. 14E illustrates a cellular phone that includes a main body 8401, a housing 8402, a display portion 8403, an audio input portion 8404, an audio output portion 8405, operation keys 8406, an external connecting port 8407, an antenna 8408, and the like. A light-emitting device that is formed by application of the present invention is used for the display portion 8403 of the cellular phone. Application of the present invention makes it possible to achieve increase in use efficiency of materials and increase in manufacturing efficiency mainly in a deposition process of a light-emitting device. Accordingly, production cost can be reduced and productivity can be improved in manufacturing a cellular phone; thus, an inexpensive cellular phone can be provided.

Figure 15A:
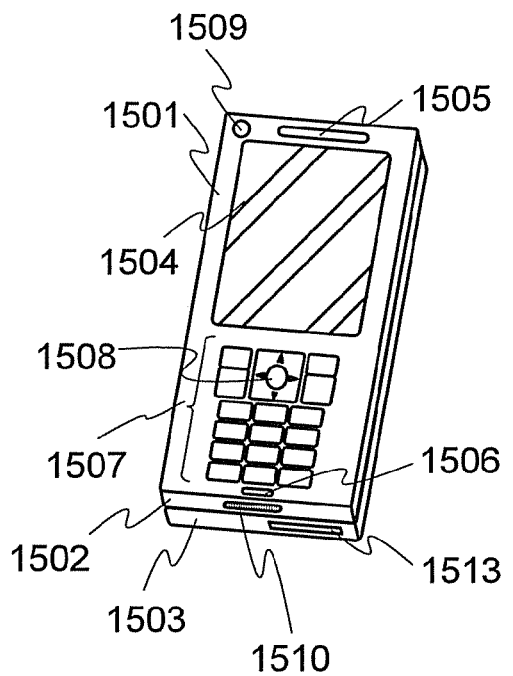
FIGS. 15A to 15C are views each illustrating an electronic appliance.
Figure 15B:
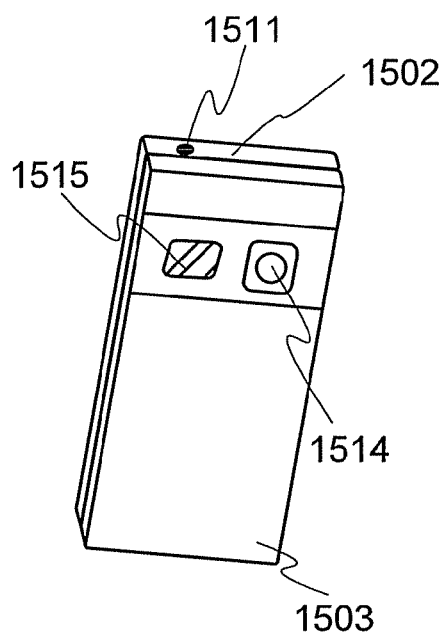
Figure 15C:
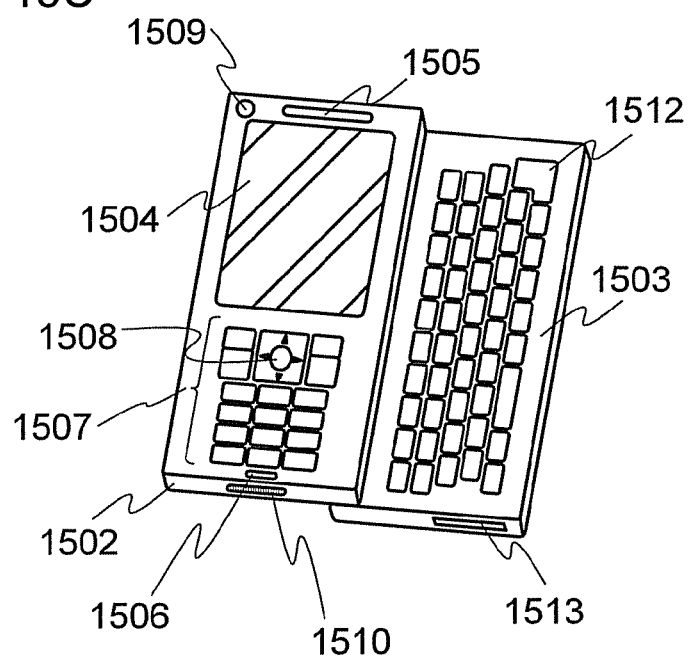

FIGS. 15A to 15C also illustrate a cellular phone. FIG. 15A is a front view, FIG. 15B is a rear view, and FIG. 15C is a development view. A main body 1501 has both functions of a cellular phone and a portable information terminal, and incorporates a computer; thus, the cellular phone is a so-called smartphone that is capable of a variety of data processing in addition to voice calls.

The main body 1501 includes two housings: a housing 1502 and a housing 1503. The housing 1502 includes a display portion 1504, a speaker 1505, a microphone 1506, operation keys 1507, a pointing device 1508, a camera lens 1509, an external connecting terminal 1510, an earphone terminal 1511, and the like, while the housing 1503 includes a keyboard 1512, an external memory slot 1513, a camera lens 1514, a light 1515, and the like. In addition, an antenna is incorporated in the housing 1502.

In addition to the aforementioned structure, a wireless IC ship, a small-size memory device, or the like may be incorporated therein.

The light-emitting device described in the above embodiment modes can be incorporated in the display portion 1504, and a display orientation changes depending on a use mode. Since the camera lens 1509 is provided on the same plane as the display portion 1504, the cellular phone can be used as a videophone. Furthermore, a still image and a moving image can be taken with the camera lens 1514 and the light 1515 using the display portion 1504 as a viewfinder. The speaker 1505 and the microphone 1506 can be used for video calls, recording and playing sound, and the like without being limited to voice calls.

The operation keys 1507 can be used for incoming and outgoing calls, simple input of information such as e-mail, scroll of a screen, cursor motion, and the like. Furthermore, the housings 1502 and 1503 overlapping each other (FIG. 15A) slide and can be developed as illustrated in FIG. 15C, so that the cellular phone can be used as a portable information terminal. In this case, smooth operation is possible with the use of the keyboard 1512 and the pointing device 1508. The external connecting terminal 1510 can be connected to an AC adaptor and various types of cables such as a USB cable, so as to perform charging of the cellular phone, and data communication with a personal computer or the like. Furthermore, a large amount of data can be stored and moved with a recording medium inserted into the external memory slot 1513.

The cellular phone may be equipped with an infrared communication function, a television receiving function, and the like, in addition to the aforementioned functions.

Note that a light-emitting device that is formed by application of the present invention is used for the display portion 1504 of the aforementioned cellular phone. Application of the present invention makes it possible to achieve increase in use efficiency of materials and increase in manufacturing efficiency mainly in a deposition process of a light-emitting device. Accordingly, production cost can be reduced and productivity can be improved in manufacturing a cellular phone; thus, an inexpensive cellular phone can be provided.

In such a manner, electronic appliances or lighting equipment can be obtained by using the light-emitting device of the present invention. The application range of the light-emitting device of the present invention is so wide that the present invention can be applied to electronic appliances in various fields.

Note that the structure shown in this embodiment mode can be combined with any of the structures shown in Embodiment Modes 1 to 8 as appropriate.

This application is based on Japanese Patent Application serial No. 2007-333565 filed with Japan Patent Office on Dec. 26, 2007, the entire contents of which are hereby incorporated by reference.

What is claimed is:

1. A method for manufacturing a light-emitting device comprising:
   forming a reflective layer over one surface of a first substrate;
   forming a thermal insulation layer over the reflective layer;
   forming an opening in the reflective layer and the thermal insulation layer to expose the first substrate;
   forming a light absorption layer in the opening over the first substrate and over the thermal insulation layer;
   forming a non-transfer material layer directly on the light absorption layer over the thermal insulation layer and a transfer material layer directly on the light absorption layer in the opening, wherein non-transfer material layer is spaced apart from transfer material layer and the non-transfer material layer and transfer material layer have compositions or stacks of compositions that are the same;
   disposing the first substrate and a second substrate so that a deposition target surface of the second substrate faces the one surface of the first substrate;
   irradiating the first substrate with light; and
   evaporating the transfer material layer onto the deposition target surface of the second substrate.

2. The method for manufacturing a light-emitting device according to claim 1, wherein the reflective layer has a thickness of 10 nm to 1 μm, and the thermal insulation layer has a thickness of 1 μm to 2 μm.

3. The method for manufacturing a light-emitting device according to claim 1, wherein the second substrate is provided with an electrode, and the transfer material layer is deposited over the electrode.

4. The method for manufacturing a light-emitting device according to claim 1, wherein the light is infrared light.

5. The method for manufacturing a light-emitting device according to claim 1, wherein the reflective layer has a reflectance of 85% or more for the light.

6. The method for manufacturing a light-emitting device according to claim 1, wherein the reflective layer contains at least one of aluminum, silver, gold, platinum, copper, an alloy containing aluminum, and an alloy containing silver.

7. The method for manufacturing a light-emitting device according to claim 1, wherein a thermal conductivity of a material used for the thermal insulation layer is lower than that of materials used for the reflective layer and the light absorption layer.

8. The method for manufacturing a light-emitting device according to claim 1, wherein the thermal insulation layer contains at least one of titanium oxide, silicon oxide, silicon nitride oxide, and zirconium oxide.

9. The method for manufacturing a light-emitting device according to claim 1, wherein the light absorption layer in the opening over the first substrate and over the thermal insulation layer has a reflectance of 70% or less for the light.

10. The method for manufacturing a light-emitting device according to claim 1, wherein the light absorption layer in the opening over the first substrate and over the thermal insulation layer has a thickness of 200 nm to 600 nm.

11. The method for manufacturing a light-emitting device according to claim 1, wherein the light absorption layer in the opening over the first substrate and over the thermal insulation layer contains at least one of tantalum nitride, titanium, and carbon.

12. The method for manufacturing a light-emitting device according to claim 1, wherein the non-transfer material layer and the transfer material layer contain an organic compound.

13. The method for manufacturing a light-emitting device according to claim 1, wherein the non-transfer material layer and the transfer material layer contain at least one of a light-emitting material and a carrier-transporting material.

14. The method for manufacturing a light-emitting device according to claim 1, wherein the light-emitting device is incorporated in at least one selected from the group consisting of a computer, a camera, a desk lamp, and a phone.

15. The method for manufacturing a light-emitting device according to claim 1, wherein a side surface of the transfer material layer is in contact with a side surface of the thermal insulation layer.

16. The method for manufacturing a light-emitting device according to claim 1, wherein the transfer material layer and non-transfer material layer is coextensive with the light absorption layer in the opening over the first substrate and with the light absorption layer over the thermal insulation layer.

* * * * *